US011710960B2

(12) United States Patent
Tan et al.

(10) Patent No.: US 11,710,960 B2
(45) Date of Patent: *Jul. 25, 2023

(54) CONTROL AND OPERATION OF POWER DISTRIBUTION SYSTEM

(71) Applicant: Pony AI Inc., Grand Cayman (KY)

(72) Inventors: Kai Tan, Fremont, CA (US); Ran Chen, Fremont, CA (US); Bo Pan, Beijing (CN)

(73) Assignee: Pony AI Inc., Grand Cayman (KY)

(*) Notice: Subject to any disclaimer, the term of this patent is extended or adjusted under 35 U.S.C. 154(b) by 360 days.

This patent is subject to a terminal disclaimer.

(21) Appl. No.: 17/039,810

(22) Filed: Sep. 30, 2020

(65) Prior Publication Data

US 2022/0102966 A1   Mar. 31, 2022

(51) Int. Cl.
| | |
|---|---|
| *H02H 7/00* | (2006.01) |
| *H02H 7/22* | (2006.01) |
| *H02H 1/00* | (2006.01) |
| *G01K 3/00* | (2006.01) |
| *G01R 31/40* | (2020.01) |
| *G01R 31/00* | (2006.01) |
| *B60R 16/03* | (2006.01) |

(52) U.S. Cl.
CPC .............. *H02H 7/222* (2013.01); *B60R 16/03* (2013.01); *G01K 3/005* (2013.01); *G01R 31/006* (2013.01); *G01R 31/40* (2013.01); *H02H 1/0007* (2013.01)

(58) Field of Classification Search
None
See application file for complete search history.

(56) References Cited

U.S. PATENT DOCUMENTS

| | | | | |
|---|---|---|---|---|
| 7,420,292 | B2 * | 9/2008 | Busdiecker | H02J 1/14 307/11 |
| 8,891,218 | B2 * | 11/2014 | Holley | H03K 17/18 361/86 |
| 9,209,622 | B2 | 12/2015 | Wishman et al. | |
| 9,898,026 | B2 | 2/2018 | Ewing et al. | |
| 10,882,475 | B2 * | 1/2021 | Kaußler | H02H 3/202 |
| 2018/0315569 | A1 * | 11/2018 | Hoffmann | H01H 50/14 |
| 2018/0329470 | A1 | 11/2018 | Morales et al. | |

* cited by examiner

*Primary Examiner* — Stephen W Jackson

(57) ABSTRACT

Provided herein is a power distribution system comprising a main power bus, sub-buses coupled to the main power bus, and a controller. The sub-buses provide power to electrical components of a vehicle. Each of the sub-buses includes an electrically programmable fuse in series with a relay. The controller is configured to detect a fault in a sub-bus of the sub-buses, determine a fault type associated with the fault, and in response to determining the fault type, generate a command to cause the relay to change a relay state.

20 Claims, 15 Drawing Sheets

1000

```
┌─────────────────────────────────────────────────────────────────────┐
│ Detect a fault in a sub-bus of a plurality of sub-buses based on a  │
│ telemetry signal from an electrically programmable fuse (eFuse)     │
│ associated with the sub-bus, wherein the plurality of sub-buses     │
│ are coupled to a main power bus                                     │
│                              1002                                   │
└─────────────────────────────────────────────────────────────────────┘
                                 │
                                 ▼
┌─────────────────────────────────────────────────────────────────────┐
│ Determine a fault type associated with the fault based on the       │
│ telemetry signal from the eFuse                                     │
│                              1004                                   │
└─────────────────────────────────────────────────────────────────────┘
                                 │
                                 ▼
┌─────────────────────────────────────────────────────────────────────┐
│ Generate a command to cause a relay associated with the sub-bus to  │
│ change to a relay state                                             │
│                              1006                                   │
└─────────────────────────────────────────────────────────────────────┘
```

FIGURE 10

CONTROL AND OPERATION OF POWER DISTRIBUTION SYSTEM

BACKGROUND

Electrical components associated with autonomous or semi-autonomous vehicles such as sensors, communication devices, computing devices, and infotainment devices require a steady supply of power so these electrical components can operate reliably. Under conventional approaches, power needed to operate these electrical components can be provided by one or more vehicle batteries. In general, vehicle batteries are based on lead acid battery chemistry and are mainly designed for use in combustion engine vehicles. These vehicle batteries generally can last anywhere from two to five years, depending on loads, before needing a replacement. However, vehicle batteries, when used in autonomous vehicles, generally have a much shorter life span because loads associated with autonomous vehicles are much higher than those of combustion engine vehicles. As such, vehicle batteries, when used in autonomous vehicles, may need frequent replacements which may interrupt and/or compromise autonomous vehicles operations.

SUMMARY

Described herein, in various embodiments, is a power distribution system that may comprise OR-ing controllers or an OR-ing circuit configured to regulate operations or transmission of power from a main power path including a main power supply and a backup power path including a low-voltage battery. The power may be transmitted to a main power bus and sub-buses or channels coupled to the main power bus. Each of the sub-buses or channels may comprise a terminal or outlet through which power from the main power path or the backup power path is transmitted to a component. An inlet of the power distribution system may be coupled to the main power supply and/or the low-voltage battery. The power distribution system may further comprise a microcontroller configured to acquire data in each of the sub-buses such as voltage and current and control operations associated with each of the sub-buses based on the acquired data.

In some embodiments, the power distribution system may comprise a feedback circuit. The feedback circuit may be configured to regulate a voltage of the main power path including the main power supply connected in series with an electric power converter. The feedback circuit may be connected to the main power path. In some embodiments, the feedback circuit may include a relay in series with a transistor. In some embodiments, the electric power converter comprises a direct current (DC)-to-DC converter. In some embodiments, the transistor comprises a N-Channel Metal Oxide Semiconductor Field Effect Transistor (MOSFET). In some embodiments, the relay is disposed downstream with respect to the N-Channel MOSFET. In some embodiments, the feedback circuit is configured to determine whether the voltage from the DC-to-DC converter is below a threshold voltage and compensate for the voltage from the DC-to-DC converter in response to the voltage being below the threshold voltage.

In some embodiments, the OR-ing controllers comprise a second N-Channel MOSFET. The OR-ing controllers may be configured to control a status of and/or a transmission of power from the main power path and the backup power path, such as, whether the main power bus obtains power from the main power path or the backup power path, with two groups having the aforementioned circuitry, or in other words, two groups having a same or similar circuitry that each include the N-Channel MOSFET.

In some embodiments, each of the sub-buses comprise a second relay connected in series with an electrically programmable fuse (eFuse), the eFuse comprising a third N-Channel MOSFET, the eFuse configured to protect each of the sub-buses from an inrush current, overcurrent condition, or a short circuit.

In some embodiments, the microcontroller is configured to further control a status of the second relay in a sub-bus of the sub-buses to switch from an open state to a closed state before the third N-Channel MOSFET in the sub-bus is switched from an off state to an on state, or switch from a closed state to an open state after the third N-Channel MOSFET is switched from an on state to an off state.

In some embodiments, the relay is disposed upstream of the eFuse.

In some embodiments, the microcontroller is configured to detect whether the eFuse is shut down, and in response to detecting the eFuse is shut down, attempt to turn on the eFuse.

In some embodiments, the OR-ing controllers comprise an integrated circuit (IC) comprising an anode pin connected to a source of the second N-Channel MOSFET and a cathode pin connected to a drain of the second N-Channel MOSFET. In some embodiments, the OR-ing controllers are configured to implement a reverse polarity protection circuit by switching the second N-Channel MOSFET to an off state from an on state in response to a reverse current condition being detected across the anode pin and the cathode pin of the second N-Channel MOSFET.

In some embodiments, the second N-Channel MOSFET is connected to an ideal diode rectifier. The ideal diode rectifier may comprise an anode pin connected to a source of the N-Channel MOSFET and a cathode pin connected to a drain of the N-Channel MOSFET, the ideal diode rectifier being configured to implement a reverse polarity protection circuit by switching the second N-Channel MOSFET to an off state from an on state in response to a reverse current condition being detected across the anode pin and the cathode pin of the second N-Channel MOSFET.

In some embodiments, the microcontroller is configured to monitor a voltage, a current, and a temperature associated with each of the sub-buses.

Various embodiments of the present disclosure provide a method of operating a power distribution system as described above.

The method may comprise steps including, regulating, by OR-ing controllers or an OR-ing circuit, operations or transmission of power to a main power bus and sub-buses coupled to the main power bus, from the main power path and a backup power path including a low-voltage battery. The method may comprise, transmitting, through the sub-buses, the power to components through terminals or outlets of the sub-buses. The method may comprise, acquiring, by a microcontroller, data in each of the sub-buses such as voltage and current, and controlling operations associated with the transmission of the power in each of the sub-buses based on the acquired data.

In some embodiments, the method comprises regulating, by a feedback circuit, a voltage of the main power path including the main power supply connected in series with an electric power converter. The feedback circuit may be the same or similar to that as described above with respect to the power distribution system. In some embodiments, the regulating the voltage comprises determining, by the feedback circuit, whether the voltage from the electric power converter is below a threshold voltage and compensating for the voltage from the electric power converter in response to the voltage being below the threshold voltage.

In some embodiments, the OR-ing controllers are the same or similar to the OR-ing controllers as described above.

In some embodiments, the OR-ing controllers comprise a diode and a second N-Channel MOSFET. The method may further comprise, controlling, by the OR-ing controllers, a status and/or a transmission of power from the main power path and the backup power path, such as, whether the main power bus obtains power from the main power path or the backup power path.

In some embodiments, each of the sub-buses have same or similar components as described above.

In some embodiments, the method further comprises switching, by the microcontroller, a relay in a sub-bus of the sub-buses from an open state to a closed state before switching an eFuse or a N-Channel MOSFET associated with the eFuse in the sub-bus from an off state to an on state. In some embodiments, the method may further comprise connecting, in each of the sub-buses, the relay in series with the eFuse; and protecting, by the eFuse, each of the sub-buses from an inrush current, overcurrent condition, or a short circuit.

In some embodiments, the method further comprises switching, by the microcontroller, the relay in a sub-bus of the sub-buses from a closed state to an open state after switching the eFuse or the N-Channel MOSFET associated with the eFuse in the sub-bus from an on state to an off state. In some embodiments, the method further comprises detecting, by the microcontroller, whether the eFuse is shut down; and in response to detecting the eFuse is shut down, attempting to turn on the eFuse.

In some embodiments, the OR-ing controllers may be same or similar to those described above. In some embodiments, the method further comprises implementing, by the OR-ing controllers, a reverse polarity protection circuit by switching a N-Channel MOSFET associated with the OR-ing controllers to an off state from an on state in response to detecting a reverse current condition across the anode pin and the cathode pin of the N-Channel MOSFET associated with the OR-ing controllers.

In some embodiments, the method further comprises monitoring, by the microcontroller, a voltage, a current, and a temperature associated with each of the sub-buses.

Described herein, in various embodiments, is a power distribution system comprising a main power bus, sub-buses coupled to the main power bus, and a controller. The sub-buses can provide power to electrical components of a vehicle. Each of the sub-buses can include an electrically programmable fuse (eFuse) in series with a relay. The controller can be configured to detect a fault in a sub-bus of the sub-buses, determine a fault type associated with the fault, and in response, generate a command to cause the relay to change a relay state.

In some embodiments, the eFuse can comprise a transistor and a transistor controller. The transistor controller can be configured to generate a first voltage bias to the transistor to cause the transistor to be in an on state. The first voltage bias can cause current to flow from the main power bus to a sub-bus through the transistor. The current through the transistor can be monitored by the transistor controller. In response to the current exceeding a threshold value, a second voltage bias to the transistor can be generated by the transistor controller to cause the transistor to be in an off state. The second voltage bias can cease the current through the transistor. A telemetry signal can be generated. The telemetry signal can indicate a change in a transistor state.

In some embodiments, the controller can detect the fault in the sub-bus based on the telemetry signal received from the transistor controller. The telemetry signal can indicate the transistor changed from the on state to the off state.

In some embodiments, the controller can determine the fault type associated with the fault based on the change in the transistor state. The fault type can be an overcurrent condition.

In some embodiments, the relay state can be an open relay state.

In some embodiments, the controller can be further configured to generate a second command to cause the relay to change from the relay state to a second relay state. A third command can be generated to cause the eFuse to clear the fault.

In some embodiments, the second relay state can be a closed relay state.

In some embodiments, the third command can cause the transistor controller of the eFuse to generate the first voltage bias to the transistor to cause the transistor to be in the on state.

In some embodiments, the power distribution system can further comprise output power ports or terminals. Each of the output power ports or terminals can correspond to a sub-bus of the sub-buses.

In some embodiments, the output power ports can comprise one or more different connector types through which power to the electronic components of the vehicle can be distributed.

In some embodiments, the electrical components of the autonomous vehicle can include groups of: radars, cameras, light detection and ranging (LiDAR) sensors, global positioning system (GPS) devices, communication devices, computing devices, and in-cabinet infotainment devices.

In some embodiments, each group of the electronic components can receive power from a sub-bus of the sub-buses.

In some embodiments, the power distribution system can further comprise one or more temperature sensors and one or more fans. The controller is further configured to monitor temperatures associated with the power distribution system using the one or more temperature sensors, and generate an activation command to activate the one or more fans in response to one of the temperatures exceeding a threshold value.

In some embodiments, the one or more fans can draw power from a sub-bus of the sub-buses.

In some embodiments, the power distribution system can further comprise an input power port configured to receive power from a primary power source and a redundant power source and communication ports. The input power port can be connected to the main power bus. At least one of the communication ports can enable the controller to communicate to computing devices of the vehicle over a local network.

These and other features of the apparatuses, systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

FIG. 10 illustrates a flowchart of a method, in accordance with various embodiments of the present disclosure.

DETAILED DESCRIPTION

Figure 1A:
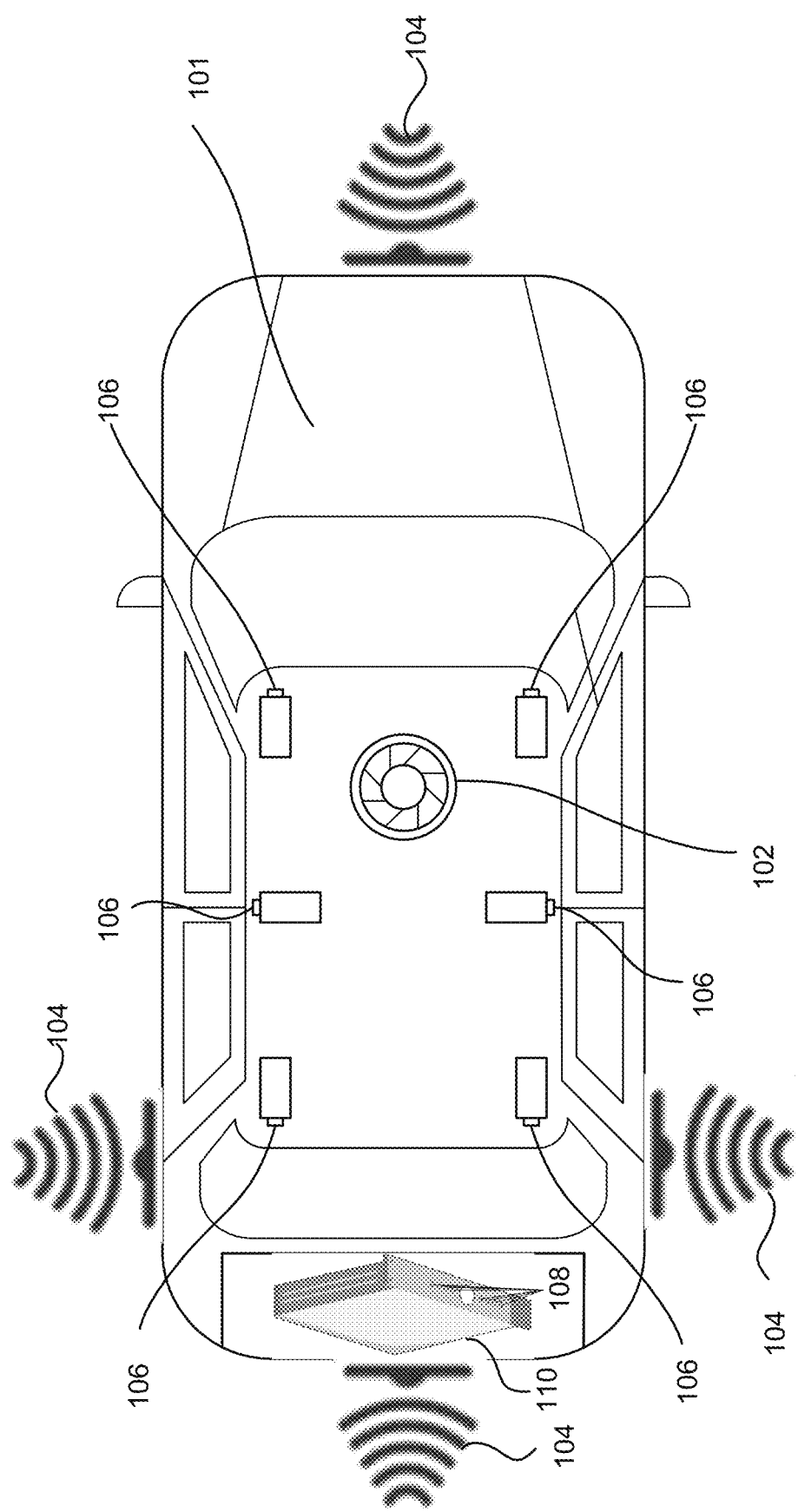
FIG. 1A illustrates an example power distribution system within a vehicle, according to an embodiment of the present disclosure.

Electrical components associated with autonomous or semi-autonomous vehicles such as sensors, communication devices, computing devices, infotainment devices, etc. require a steady supply of power so these electrical components can operate reliably. Under conventional approaches, power needed to operate these electrical components can be provided by one or more vehicle batteries (e.g., 12 volt car batteries). For example, a light detection and ranging sensor and other sensors of an autonomous vehicle can be powered by one or more vehicle batteries arranged in a parallel configuration. In general, vehicle batteries are based on lead acid battery chemistry and are mainly designed for use in combustible engine vehicles. These vehicle batteries generally can last anywhere from two to five years, depending on loads, before needing a replacement. However, vehicle batteries, when used in autonomous vehicles, generally have a much shorter life span because loads associated with autonomous vehicles are much higher than those of combustion engine vehicles. For example, vehicle batteries in an autonomous vehicle need to provide power to sensors such as light detection and ranging (LiDAR) sensors, communication devices, computing devices, and navigation devices, which a combustion engine vehicle may or may not have. As such, vehicle batteries, when used in autonomous vehicles, may need frequent replacements and thus may lead to undesired interruptions to autonomous vehicle operations.

Described herein is a solution that addresses the problems described above. Autonomous vehicles can be based on electric or hybrid vehicle platforms. Electric or hybrid vehicles can include high-voltage, high-capacity drivetrain batteries (e.g., electric vehicle or "EV" batteries) which are used to propel the electric or hybrid vehicles through electrical drivetrains (e.g., electric motors). These drivetrain batteries, unlike vehicle batteries, are designed to handle much larger loads, to be able to power more electronic components, and can last much longer before needing replacements. In various embodiments, a power distribution system can be implemented for a vehicle that is based either on an electric or hybrid vehicle. In some examples, the power distribution system 108 may be placed in a trunk of the vehicle. The power distribution system can include a main power bus and a plurality of sub-buses coupled or connected to the main power bus. The power distribution system can distribute power from drivetrain batteries of the autonomous vehicle to electronic components associated with the autonomous vehicle through the main power bus and the plurality of sub-buses. The power distribution system can reliably and safely supply continuous power to electronic components of a vehicle such as sensors, communication devices, computers, monitors, heaters, fans, lighting, power steering, infotainment systems, air conditioning, and drive-by-wire components in vehicles. The power distribution system can detect and stop current flow in response to potentially unsafe conditions, such as an overload current, short circuit, or inrush current may be prevented.

In some embodiments, the main power bus and the plurality of sub-buses can include a relay and an electrically programmable fuses (eFuse) in each of the main power bus and the plurality of sub-buses. The relay and the eFuse can provide protection against an overcurrent event. For example, in response to an overcurrent event on a voltage bus, an eFuse of the power bus may, in response, turn off ("pop the fuse"), thereby stopping the overcurrent event. Alternatively or in addition, in this example, a relay of the voltage bus may, in response, change to an open state to stop the overcurrent event.

In some embodiments, the power distribution system can include a controller such as a microcontroller. The controller can be configured to control and monitor various aspects associated with the main power bus and the plurality of sub-buses (e.g., voltage or power buses). For example, the controller can generate commands to turn on or off various electronic circuits of the power distribution system. In some examples, the controller can enable or disable a sub-bus through which power is to be provided by turning on or off an eFuse and/or a relay in-line with the sub-bus. As another example, the controller can receive telemetry signals (e.g., data) from various electronic circuits of the power distribution system. For instance, the controller can receive voltage and current readings of the main power bus and/or the plurality of sub-buses.

In some embodiments, the power distribution system can include a power source selection module. The power source selection module can select a power source, from a plurality of power sources, or a power path, to couple or connect to the main power bus. In one embodiment, the power source selection module may select from a main power path or a backup power path to supply power to the main power bus. The main power path may include a main power source, such as drivetrain batteries, and be coupled or connected to an electric power converter (e.g., a step-down converter). In another embodiment, the power source selection module can be configured to couple or connect a backup power path which may include one or more low-voltage batteries such as vehicle batteries (e.g., 12-volt car batteries) to the main power bus. In some embodiments, the power source selection module can be implemented using OR-ing controllers. In some embodiments, the power source selection module can be controlled and monitored by the controller of the power distribution system. These and other features of the power distribution system will be discussed in further detail below.

FIG. 1A illustrates an example power distribution system 110 in a vehicle 101, according to an embodiment of the present disclosure. In FIG. 1A, the vehicle 101 may be an autonomous or semi-autonomous vehicle. The vehicle 101 may include sensors such as Lidar sensors 102, radar sensors 104, cameras 106, GPS, sonar, ultrasonic, IMU (inertial measurement unit), accelerometers, gyroscopes, magnetometers, and FIR (far infrared) sensors to detect and identify objects in a surrounding environment. The sensor data may comprise pictorial or image data such as pictures or videos, audio data, audiovisual data, atmospheric data such as temperature, pressure, elevation, velocity, acceleration, and/ or location data, captured in either real-time or with a time delay. For example, the Lidar sensors 102 can generate a three-dimensional map of the environment. The Lidar sensors 102 can also detect objects in the environment. In another example, the radar systems 104 can determine distances and speeds of objects around the vehicle 101, and may be configured for adaptive cruise control and/or accident avoidance and blind spot detection. In another example, the cameras 106 can capture and process image data to detect and identify objects, such as road signs, as well as deciphering content of the objects, such as speed limit posted on the road signs. Such objects may include, but not limited to, pedestrians, road signs, traffic lights, and/or other vehicles, for example. In some embodiments, the cameras 106 can recognize, interpret, and analyze road signs including speed limit, school zone, construction zone signs and traffic lights such as red light, yellow light, green light, and flashing red light. The vehicle 101 can also include myriad actuators to propel and navigate the vehicle 101 in the surrounding. Such actuators may include, for example, any suitable electro-mechanical devices or systems to control a throttle response, a braking action, a steering action, etc. In some embodiments, based on image data captured by the cameras 106, the vehicle 101 can adjust vehicle speed based on speed limit signs posted on roadways. For example, the vehicle 101 can maintain a constant, safe distance from a vehicle ahead in an adaptive cruise control mode. In this example, the vehicle 101 maintains this safe distance by constantly adjusting its vehicle speed to that of the vehicle ahead.

In various embodiments, the vehicle 101 may navigate through roads, streets, and/or terrain with limited or no human input. The word "vehicle" or "vehicles" as used in this paper includes vehicles that travel on ground such as cars, trucks, and busses, but may also include vehicles that travel in air such as drones, airplanes, and helicopters, vehicles that travel on water such as boats, and submarines. Further, "vehicle" or "vehicles" discussed in this paper may or may not accommodate one or more passengers therein. In general, the vehicle 101 can effectuate any control to itself that a human driver can on a conventional vehicle. For example, the vehicle 101 can accelerate, brake, turn left or right, or drive in a reverse direction just as a human driver can on the conventional vehicle. The vehicle 101 can also sense environmental conditions, gauge spatial relationships between objects and the vehicle 101, detect and analyze road signs just as the human driver. Moreover, the vehicle 101 can perform more complex operations, such as parallel parking, parking in a crowded parking lot, collision avoidance, without any human input.

The power distribution system 110 may comprise terminals 108 that each connect to an electrical component of the vehicle 101, such as, for example, one of the Lidar sensors 102, one of the radar systems 104, one of the cameras 106, or another electrical component that may consume auxiliary loads such as a communication device, computer, monitor, heater, fan, lighting, power steering, infotainment system, air conditioning, or a drive-by-wire component. Each of the terminals 108 may correspond to a sub-bus or a channel specifically programmed or designed to be connected or plugged in to a particular electrical component. For example, one of the terminals 108 may be specifically programmed to connect to a Lidar sensor 102 due to programmed electrical characteristics in that terminal, and connecting to another electrical component may cause a failure or malfunction. In some examples, the power distribution system 110 may be placed in a trunk of the vehicle 101. The functions of the power distribution system 110 will be described further in the subsequent figures.

Figure 1B:
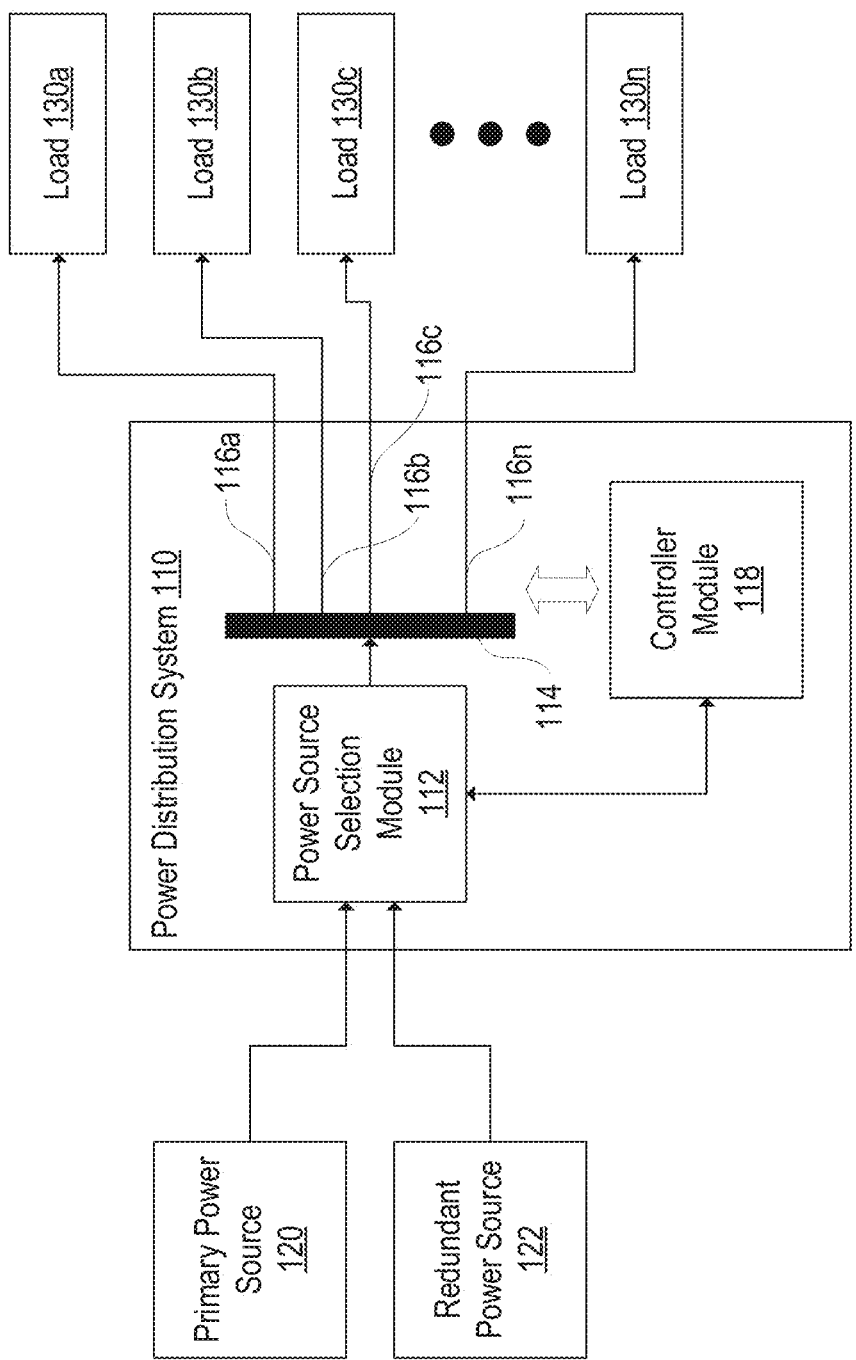
FIG. 1B illustrates an exemplary power distribution system, according to an embodiment of the present disclosure.

FIG. 1B illustrates the exemplary power distribution system 110, in accordance with various embodiments of the present disclosure. As shown in FIG. 1, in some embodiments, the power distribution system 110 can be coupled or connected to a main power supply or a primary power source 120 and a low-voltage battery or a redundant power source 122 at inlets of the power distribution system 110 and a plurality of loads 130a-130n at outlets of the power distribution system 110. The power distribution system 110 can be configured to distribute power either provided by the primary power source 120 or the redundant power source 122 to the plurality of loads 130a-130n. For example, the power distribution system 110 can distribute power provided by the primary power source 120 to the load 130a. As another example, the power distribution system 110 can distribute power provided by the primary power source 120 to the load 130b. As yet another example, the power distribution system 110 can distribute power provided by the redundant power source 122 to the load 130a.

In some embodiments, the power distribution system 110 can comprise a power source selection module 112, a main power bus 114, a plurality of sub-buses 116a-116n, and a controller 118. The power source selection module 112 can be coupled or connected to the primary power source 120 and the redundant power source 122 at its inputs and the main power bus 114 at its output. The power source selection module 112, in some embodiments, can be configured by the controller 118 to select a power source to which to couple or connect to the main power bus 114. For example, the controller 118 can generate a command to the power source selection module 112 to connect the primary power source 120 to the main power bus 114. As another example, the controller 118 can generate a command to the power source selection module 112 to connect the redundant power source 122 to the main power bus 114. In this way, the power source selection module 112 can select either power provided by the primary power source 120 or power provided by the redundant power source 122 to distribute to the plurality of loads 130a-130n, through the main power bus 114 and the plurality of sub-buses 116a-116n. In some embodiments, the power source selection module 112 can be implemented using one or more OR-ing controllers. Details of the power source selection module 112 will be discussed in further detail in reference to FIG. 4 herein.

In some embodiments, the main power bus 114 can comprise a metal bar capable of handling a total current rating of the power distribution system 110. For example, if the power distribution system 110 is designed to distribute 100 amps of current at 14 volts (e.g., a 14-volt voltage bus), the metal bar must handle at least 100 amps of current. In some embodiments, the plurality of sub-buses 116a-116n can comprise wires coupled or connected to the main power bus 114. For example, a plurality of wires can be soldered, bolted through a lug, or otherwise terminated to the metal bar. In this example, each wire of the plurality of wires can represent a sub-bus of the plurality of sub-buses 116a-116n. A gauge or thickness of a wire can indicate current handling capability of the wire. In some embodiments, different sub-buses in the plurality of sub-buses 116a-116n can have different current ratings. For example, the sub-bus 116a may have a current rating of 10 amps, while the sub-bus 116b may have a current rating of 15 amps. In this example, the wire corresponding to the sub-bus 116b may have a lower gauge and thickness than the wire corresponding to the sub-bus 116a because the sub-bus 116b is designed to handle more current.

In some embodiments, the controller 118 can be configured to control and monitor various aspects of the power distribution system 110. The controller 118 can generate commands to turn on or off various electronic circuits of the power distribution system 110. For example, the controller 118 can enable or disable a sub-bus through which power is to be distributed by turning on or off a transistor, an electrically programmable fuse (eFuse), and/or a relay in-line or in series with the sub-bus. In some embodiments, the controller 118 can receive telemetry (e.g., data) from various electronic circuits of the power distribution system 110. For example, the controller 118 can receive voltage and current readings of the main power bus 114 and/or the plurality of sub-buses 116a-116n through transistors and eFuses associated with the main power bus 114 and/or the plurality of sub-buses 116a-116n. As another example, the controller 118 can receive telemetry signals from the power source selection module 112 indicating which power source the power source selection module 112 had selected to distribute power to the plurality of loads 130a-130n.

In some embodiments, the primary power source 120 can comprise an electric power converter coupled or connected to drivetrain batteries of an electric or hybrid vehicle. The drivetrain batteries are electric vehicle (EV) batteries that can be used to power an electrical locomotive (e.g., an electric motor) to propel the electric or hybrid vehicle. The electric power converter can be configured to convert battery terminal voltage of the drivetrain batteries to a voltage suitable to power electronic components of the electric or hybrid vehicle. For example, the electric power converter can be a step-down, direct current-to-direct current (DC-to-DC) converter that converts high voltage of the drivetrain battery to a 14-volt voltage bus (e.g., a 14-volt power bus). This 14 volt voltage bus can then be used to power electronic components, such as light detection and ranging (LiDAR) sensors, cameras, communication devices, and infotainment devices. In one implementation, the electric power converter can be implemented based on a switching power converter architecture, such a Buck converter. In another implementation, the electric power converter can be implemented using a linear voltage converter architecture.

In some embodiments, the redundant power source 122 can comprise a plurality of vehicle batteries. Unlike drivetrain batteries, vehicle batteries are regular 12-volt batteries (e.g., car batteries) that are widely used in combustion engine vehicles. These vehicle batteries can be arranged in a parallel configuration to provide necessary power to power electronic components. In some embodiments, the redundant power source 122 can comprise other types of batteries or power sources. For example, in some embodiments, an uninterrupted power supply (UPS) may be used in lieu of vehicle batteries. As another example, a gasoline-powered electric power generator may be used as the redundant power source 122.

In some embodiments, the plurality of loads 130a-130n can represent various different electronic components that draw power from either the primary power source 120 or the redundant power source 122 through the power distribution system 110. For example, in some embodiments, the power distribution system 110 can be implemented in an autonomous vehicle that is based on an electric or hybrid vehicle. The power distribution system 110, in this example, can be configured to distribute power from either drivetrain batteries or vehicle batteries of the autonomous vehicle to power sensors, computing devices, communication devices of the autonomous vehicle. In this example, the plurality of loads 130a-130n can include the sensors, the computing devices, and the communication devices. In general, depending on a specific power distribution scheme of the power distribution system 110, one or more electronic components (e.g., loads) may be assigned or allocated to, in order to draw or receive power from, one or more sub-buses. For example, in one implementation, a LiDAR sensor (e.g., load 130a) may be assigned or allocated to, in order to draw or receive power from, sub-bus 116a and cameras (e.g., load 130b) may be assigned or allocated to, in order to draw or receive power from, sub-bus 116b. In another implementation, both the LiDAR sensor and the cameras may be assigned or allocated to, in order to draw or receive power from, the same sub-bus. In general, assignment or allocation of loads to particular sub-buses may be dependent on factors such as robustness, reliability, and fault-tolerant design of a power distribution system. The power distribution system 110 will discussed in further detail below.

Figure 2:
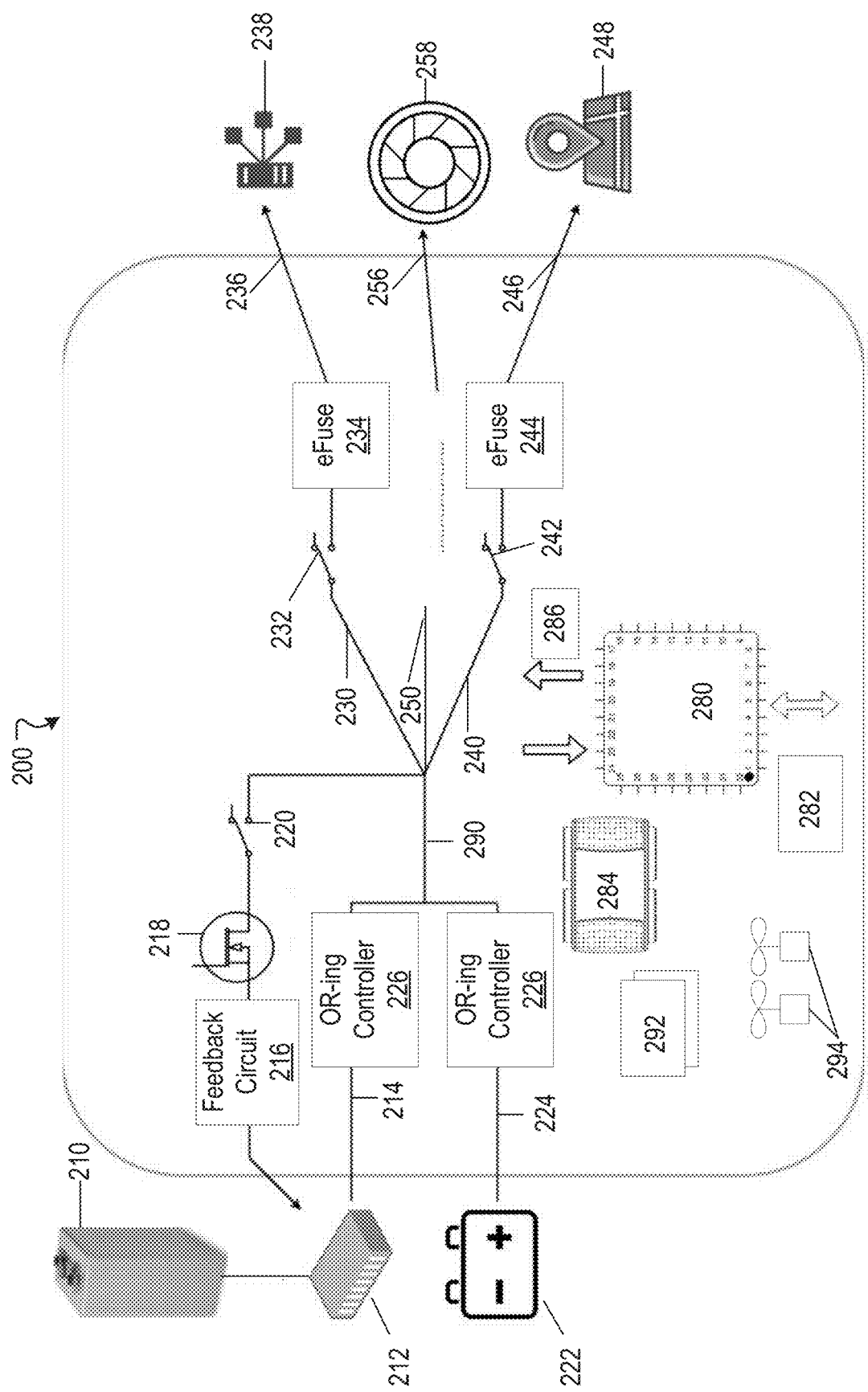
FIG. 2 illustrates an exemplary power distribution system, in accordance with various embodiments of the present disclosure.

FIG. 2 illustrates an exemplary power distribution system 200, in accordance with various embodiments of the present disclosure. In some embodiments, the power distribution system 110 of FIG. 1 can be implemented as the power distribution system 200. As shown in FIG. 2, in some embodiments, a main power source 210 (e.g., the primary power source 120 of FIG. 1) may include a high-voltage battery (e.g., the drivetrain batteries of FIG. 1) which may range from 24 volts to 800 volts, inclusive. The main power source 210 may be coupled or connected in series to an electric power converter 212. In some embodiments, the electric power converter 212 may be a DC-to-DC converter that converts battery terminal voltage of the main power source 210 to a voltage suitable for powering electronic components. For example, depending on vehicle types, the electric power converter 212 may convert the battery terminal voltage of the main power supply 210 to either a 24-volt or 14-volt voltage bus to power the electronic components. For instance, if the power distribution system 210 is designed to be implemented in a freight truck, the electric power converter 212 may convert the battery terminal voltage of the main power supply 210 to a 24-volt voltage bus. If the power distribution system 210 is designed to be implemented in a passenger vehicle or light truck, the electric power converter 212 may convert the battery terminal voltage of the main power supply 210 to a 14-volt voltage bus. In some embodiments, the power distribution system 200 may additionally provide a 5-volt voltage bus which can be used in digital signal switching associated with the power distribution system 220. In some embodiments, voltage provided to the electric power converter 212 may be fed into a main power path 214. In some cases, the voltage provided by the electric power converter 212 may be regulated by a feedback circuit 216. The enabling or disabling of the feedback circuit 216 may be determined by a state of a transistor 218 connected in series with and upstream of a relay 220. In some embodiments, the transistor 218 may be a N-Channel Metal Oxide Semiconductor Field Effect Transistor (MOSFET) and/or may be a part of an electrically programmable fuse (eFuse). In some embodiments, the relay 220 may be a single pull double throw (SPDT) relay. Thus, if the relay 220 is in a closed state and the transistor 218 is in an on state, the feedback circuit 216 may be enabled. Otherwise, the feedback circuit 216 may be disabled.

In some embodiments, the feedback circuit 216 may detect or determine whether an output voltage of the electric power converter 212 (i.e., an input voltage of the power distribution system 200) is at a desired voltage (e.g., 14 volts or 24 volts). If the output voltage of the electric power converter 212 falls below the desired voltage, the output voltage may be inadequate to supply power to electronic components such as 238, 248, and 258. The feedback circuit 216 may need to compensate for the inadequate output voltage. For example, the feedback circuit 216 may provide a signal to the electric power converter 212 that changes a duty cycle or a switching frequency associated with the electric power converter 212 to bring the output voltage of the electric power converter 212 back to the desired voltage.

In some embodiments, the power distribution system 200 may include a backup power path 224. The backup power path 224, along with the main power path 214, may be controlled by OR-ing controllers 226 (e.g., the power source selection module 112 of FIG. 1), which will be described in more detail in reference to FIG. 3 and FIG. 4 herein. The backup power path 224 may automatically and seamlessly be configured to provide power to the electronic components 238, 248, and 258 when the main power path 214 is shut off from providing power, or is otherwise not operational. The backup power path 224 may not provide power under normal circumstances, when the main power path 214 is on and operating properly. The OR-ing controllers 226, therefore, can be configured to select a power source with which to provide power to the electronic components 238, 248, and 258. In some embodiments, the backup power path 224 may be connected to an input power source such as a low-voltage battery 222 (e.g., the vehicle batteries of FIG. 1). The input power source 222 may have voltage ranging from 12 volts to 18 volts, in some examples. In some embodiments, the input power source 222 may be a lead acid battery. In such a manner, the backup power path 224 and the main power path 214 may form a dual input power system without utilizing the input power source 222 while the main power path 214 is successfully running, thereby extending life of the input power source 222.

In some embodiments, the power distribution system 200 may include a main power bus 290 (e.g., a voltage bus). Power from either the main power path 214 or the backup power path 224 may be provided to channels or sub-buses 230, 240, and 250 (e.g., the plurality of sub-buses of FIG. 1) through the main power bus 290. The power distribution system 200 through the main power bus 290 and the sub-buses 230, 240, and 250 can supply or provide power to the electronic components 238, 248, and 258, respectively. The sub-bus 230 may include a relay 232 connected in series with and upstream of an electrically programmable fuse (eFuse) 234. The eFuse 234 may be implemented using a N-Channel MOSFET, as will be described further in reference to FIG. 5 herein. The electronic component 238 may be, for example, a high performance computing (HPC) equipment, and connected to the sub-bus 230 at a terminal 236. The sub-bus 240 may include a relay 242 in series with and upstream of an eFuse 244. The eFuse 244 may be implemented using a N-Channel MOSFET. The electronic component 248 may connect to the sub-bus 240 at a terminal 246. The electronic component 248 may be, for example, a GPS system. The sub-bus 250 may include a relay in series with and upstream of an eFuse (not shown for simplicity). The electronic component 258 may connect to the sub-bus 250 at a terminal 256. The electronic component 258 may be, for example, a LiDAR. Each of the electronic components 238, 248, and 258 may be connected to the respective terminals 236, 246, and 256, using blind mate connectors. In some embodiments, a number of channels or sub-buses may be between eight and twenty-four. In some examples, a number of channels or sub-buses may be nine. In some embodiments, the relays 232 and 242 may be single pole double throw (SPDT) relays or single pole single throw (SPST) relays.

In some embodiments, the power distribution system 200 may include a microcontroller 280 (e.g., the controller 118 of FIG. 1). The microcontroller 280 may acquire data (e.g., telemetry), such as voltage and current readings, from each of the channels or sub-buses 230, 240, and 250. For example, the microcontroller 280 can monitor voltage and current delivered to the electronic component 238 through the eFuse 234. As another example, the microcontroller 280 can monitor a status of the relay 232. For instance, the microcontroller 280 can determine whether the relay 232 is in a closed or an open state or position. In some embodiments, the microcontroller 280 may be programmed to control various operations associated with each of the sub-buses 230, 240, and 250 based on the acquired data. For example, when the microcontroller 280 determines that voltage and/or current reading of the sub-bus 230 is abnormal, the microcontroller 280 may send commands to disable or turn off the eFuse 234, if the eFuse 234 has not already been disabled or turned off. Alternatively or in addition, the microcontroller 280 may send commands to switch the relay 232 from a closed state to an open state. In this way, any potential faults associated with the sub-bus 230 and/or the electronic component 238 are isolated from the main power bus 290 and, thus, would not cause voltage of the main power bus 290 to collapse—being "dragged down." In some cases, after a fault associated with a sub-bus or channel clears, the microcontroller 280 may send commands to restore power provided to the sub-bus or channel. For example, continuing from the example above, after the potential faults associated with the channel or sub-bus 230 have been cleared, the microcontroller 280 may send signals to switch the relay 232 from the open state back to the closed state. Alternatively or in addition, the microcontroller 280 may send signals to enable or turn on the eFuse 234. In this way, power provided through the channel or sub-bus 230 can be restored. Further, such measures of controlling the closing of the relay 232 prior to turning on the eFuse 234 can prevent inrush current through the channel or sub-bus 230, which may shorten operating life of the relay 232. Additionally, such measures greatly reduce chances of current arcs on the relay 232 as the relay 232 switches from an open state to a closed state, or vice versa. Additionally, if inrush current or other factors trigger a voltage drop, the microcontroller 280 may provide voltage drop protection on an order of microseconds. For example, the microcontroller 280 can respond to a voltage drop by sending a command to open a relay. This command can be generated in microseconds in response to the voltage drop. In some cases, the microcontroller 280 may reboot to recover communication with an eFuse if a communication with the eFuse is lost. For example, in such a rebooting scenario, the microcontroller 280 may control switching of any of the relays 232, 242, and/or 252, such that any of the relays 232, 242, and/or 252 may be switched from an open state to a closed state before switching any of the respective eFuses 234, 244, and/or 254, from an off state to an on state. For example, the microcontroller 280 may control the relay 232 to be switched to a closed state before the transistor 234 is switched to an on state, if the microcontroller 280 determines that power is to be transmitted through the sub-bus 230.

In some embodiments, the microcontroller 280 may determine measures to be taken if any operating parameters in any of the sub-buses or channels 230, 240, and/or 250 become unsafe. For example, the microcontroller 280 may determine whether to turn off any of the eFuses such as the eFuses 234 and/or 244. The microcontroller 280 may take into account a current rating in each of the sub-buses or channels 230, 240, and/or 250. Once an eFuse is shut down, or if the eFuse is otherwise nonoperational, such as, in a short or a failed state, the microcontroller 280 may determine whether the operating parameters safely allow that eFuse to be turned back on, and if so, the microcontroller 280 may attempt to turn that eFuse back on. The microcontroller 280 may control the relays such as the relays 232 and/or 242 and control coil voltages of any of the relays such as the relays 232 and/or 242. The microcontroller 280 may acquire and/or monitor data about voltage, current, power consumption, statuses, and/or temperatures associated with each of the sub-buses or channels 230, 240, and 250. The microcontroller 280 may further acquire data about humidity of the power distribution system 200, and in response, send a command to control a liquid cooling system based on the humidity.

In some embodiments, the microcontroller 280 may relay or communicate data (e.g., telemetry) acquired from the sub-buses 230, 240, and 250, and other electronic components to other computing devices or systems via a controller area network (CAN) bus 282, which may be a dual CAN bus interface. Other communication protocols including ethernet, RS232, I2C, SPI, PWM, and GPIO, and/or other communication protocols supported by 802.11 wireless standards may be use in lieu or in addition to the CAN bus 282.

The microcontroller 280 may further communicate with input/outlet (I/O) devices such as a data acquisition (DAQ) system 284, which may further include analog-to-digital (AC/DC) converters, and one or more other I/O devices 286.

In some embodiments, the power distribution system 200 can include one or more temperature sensors 292 and one or more fans 294. The one or more temperature sensors 292 can be disposed to various regions, circuits, or components of the power distribution system 200 to measure temperatures at those regions, circuits, or components. For example, a temperature sensor can be disposed at or near the microcontroller 280 to measure heat generated by the microcontroller 280. As another example, temperature sensors can be dispose at or near the eFuses 234, 244 to measure heat generated by the eFuses 234, 244. The one or more fans 294 can be configured by the microcontroller 280 to turn on in response to temperatures measured by the one or more temperature sensors 292 exceeding a threshold temperature value. For example, the one or more fans 294 can be configured to be turned on when at least one temperature measured by the one more temperature sensors 292 exceeds 50 degree Celsius. Many variations are possible. In some embodiments, the microcontroller 280 may further adjust a speed of the one or more fans 294, a radiator fan, and/or a coolant pump based on a measured current in one or more of, or a total sum of the currents in the sub-buses 230, 240, and 250, or an overall current of the main bus 290. For example, a duty cycle of the coolant pump may be adjusted to be proportional to the sum of the currents in the sub-buses 230, 240, and 250. The one or more fans 294 and the one or more coolant pumps may operate via pulse width modulation (PWM). Fault criteria of the coolant pump or a switch of the coolant pump may be defined based on how long the coolant pump and/or the switch are operating under abnormal conditions. For example, if abnormal operation of the coolant pump is detected continuously for longer than a threshold time period, such as five seconds, a fault may be sent via the CAN bus. Abnormal operation may occur if a duty cycle of the coolant pump falls outside an allowable duty ratio, such as, if the duty cycle becomes 100% or 0%. In another example, if the switch of the coolant pump is an open circuit for longer than a second threshold time period, such as ten seconds, a fault may be sent via the CAN bus.

Figure 3:
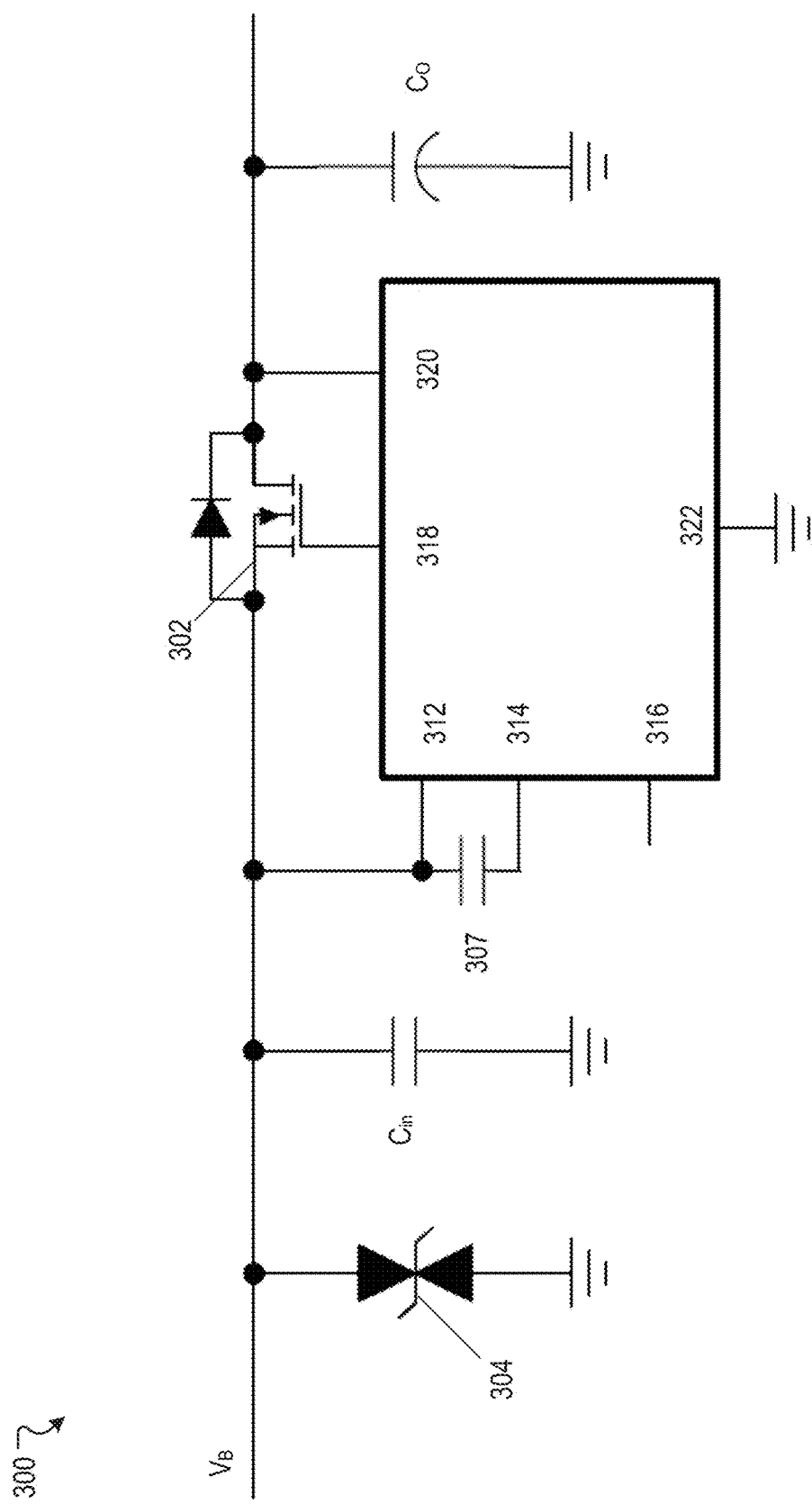
FIG. 3 illustrates an exemplary OR-ing controller or circuit, in accordance with various embodiments of the present disclosure.

FIG. 3 illustrates an exemplary OR-ing controller 300, in accordance with various embodiments of the present disclosure. In some embodiments, the power source selection module 112 of FIG. 1 may be implemented with one or more of the OR-ing controller 300. As shown in FIG. 3, the OR-ing controller 300 may provide reverse polarity protection using an ideal diode rectifier. A voltage Vs from an input power source, such as from the input power source 222 of FIG. 2, may be used to drive a transistor 302, which may be a N-Channel MOSFET. A transient-voltage-suppression (TVS) diode 304 may protect the OR-ing controller 300 from positive and negative transient voltages. The TVS diode 304 may include two unidirectional diodes or a single bidirectional diode. Cm may be an input capacitance. An output capacitance Co may prevent voltage output from the transistor 302 from collapsing due to power line disturbance. A pin 312 may be an anode of the ideal diode and supply input power, and may be connected to a source of the transistor 302. A pin 314 may be connected to a charging capacitor 307 which provides power to turn on the transistor 302. The charging capacitor 307 may be supplied a charging current by a charge pump, which may be enabled when a voltage at an enable pin 316 is above a threshold voltage. The enable pin 316 may be connected to the pin 312 and always be in an on state, or alternatively, may be switched on and off, for example, by a binary signal. A pin 318 may be a gate drive output and connected to a gate of the transistor 302. A pin 320 may be a cathode of the diode and connect to a drain of the transistor 302. A pin 322 may be a ground pin. In response to a reverse current condition being detected across the pin 312 and the pin 320, for example, when a voltage across the pin 312 and the pin 320 is reduced to below a threshold voltage, the pin 318 may be internally connected to the pin 312, resulting in the switching of the transistor 302 to an off state. In general, whether the transistor 302 is in an on or off state depends on a voltage bias applied to the gate of the of transistor 302 by the gate drive output pin 318. For example, when a voltage bias of 5 volts is applied by the gate drive output pin 318, the transistor 302 is turned on so that the OR-ing controller 300 can allow current to pass through the transistor 302. On the other hand, as another example, when a voltage bias of 0 volts is applied by the gate drive output pin 318, the transistor 302 is turned off. In this example, the OR-ing controller 300 does not allow current to pass through the transistor 302, thereby shutting down a power source to which the OR-ing controller 300 is connected.

Figure 4:
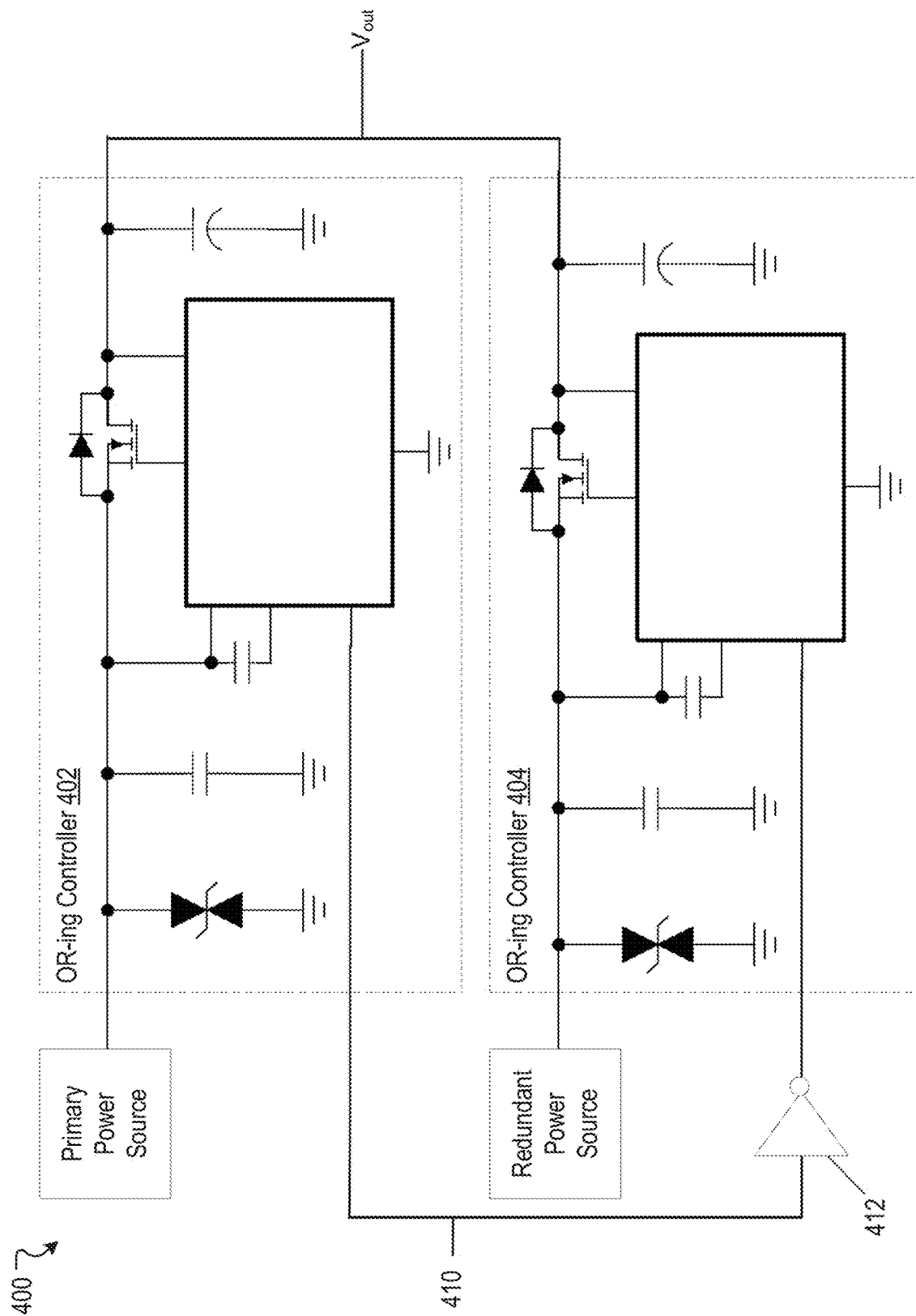
FIG. 4 illustrates an exemplary power source selection module, in accordance with various embodiments of the present disclosure.

FIG. 4 illustrates an exemplary power source selection module 400, in accordance with various embodiments of the present disclosure. In some embodiments, the power source selection module 112 of FIG. 1 may be implemented as the power source selection module 400. As shown in FIG. 4, the power source selection module 400 can comprise two OR-ing controllers 402, 404, with each OR-ing controller coupled or connected to a power source. The OR-ing controllers 402 and 404 may each be implemented as the OR-ing controller 300. For example, the OR-ing controller 402 can be coupled or connected to a primary power source such as the main power source 210 and the electric power converter 212 of FIG. 2. As another example, the OR-ing controller 404 can be coupled or connected to a redundant power source such as the input power source 222 of FIG. 2. In some embodiments, the power source selection module 400 may select a power source to which to distribute power to electronic components based on a control line 410. The control line 410 can include a control signal which can be provided to enable pins of the OR-ing controllers 402, 404 (e.g., the enable pin 316 of FIG. 3). Based on voltage level or binary pattern encoded in the control signal, the control line 410 can switch on or off transistors of the OR-ing controllers 402, 404 (e.g., the transistor 302 of FIG. 3), thereby allowing current to either pass through or not pass through the transistors. In some embodiments, the power source selection module 400 may include an inverter 412 connected in series with the control line 410 to an OR-ing controller. For example, as shown in FIG. 4, the control line 410 to the enable pin of the OR-ing controller 404 can include the inverter 412 connected in series. The inverter 412 can invert the control signal encoded in the control line 410. For example, a control signal encoded in the control line 410 can have a binary value of 1 (or 5 volts). In this example, the inverter 412 can inverter the control signal from the binary value of 1 to a binary value of 0 (or 0 volts). The inclusion of the inverter 412 in the power source selection module 400 enables the power source selection module 400 to select a power source from either the primary power source or the redundant power source to which to distribute power. For example, a control signal containing a binary value of 1 carried in the control line 410 can reach the enable pin of the OR-ing controller 402. This control signal can cause the OR-controller 402 to turn on the transistor of the OR-ing controller 402, thereby allowing current to pass through to the OR-ing controller 402. In this example, because of the inverter 412, when the control signal reaches the enable pin of the OR-ing controller 404, the control signal now has a binary value of 0 (or 0 volts) which causes the OR-ing controller 404 to turn off the transistor of the OR-ing controller 404, thereby effectively shutting off current from pass through the OR-ing controller 404.

Figure 5:
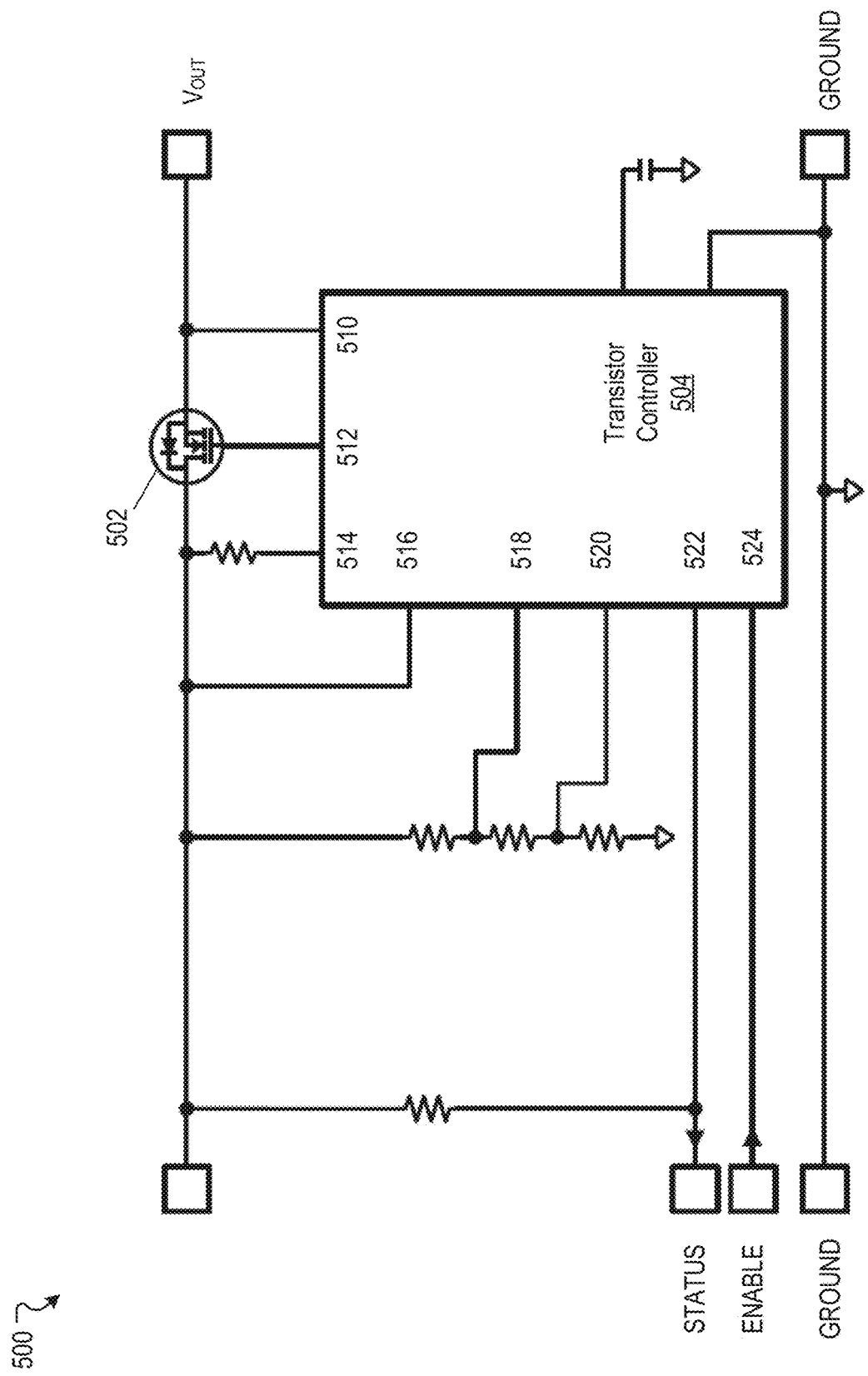
FIG. 5 illustrates an exemplary electrically programmable fuse, in accordance with various embodiments of the present disclosure.

FIG. 5 illustrates an exemplary electrically programmable fuse (eFuse) 500, in accordance with various embodiments of the present disclosure. In some embodiments, the eFuse 500 may comprise a transistor 502 and a transistor controller 504. The transistor controller 504, in some embodiments, can be a semiconductor device (e.g., a chip) comprising a plurality of input and output pins to control and monitor various attributes of the eFuse 500. For example, the transistor controller 504 can generate, through the output pins, a voltage bias to turn on or off the transistor 502. As another example, the transistor controller 504 can monitor voltage and current associated with the eFuse 500 through the input pins. As shown in FIG. 5, in some embodiments, the transistor controller 504 can include an output voltage sense pin 510 connected to an output of the transistor 502, a gate drive output pin 512 connected to a gate of the transistor 502, a voltage sense input pin 514 connected to an input of the transistor 502, a supply voltage input 516 pin to power the transistor controller 504, an under-voltage lock-out comparator input pin 518, an over-voltage protection comparator input pin 520, a fault status input pin 522, and an enable input in 524. Through these pins, the transistor controller 504 can be configured to control and monitor various attributes of the eFuse 500.

In various embodiments, the eFuse 500 may provide overcurrent and short circuit protection of a voltage bus (e.g., a power bus, a sub-bus, etc.) to which the eFuse 500 is connected to. For example, in an overcurrent scenario, if current through the transistor 502 exceeds a threshold voltage to which the eFuse 500 is programmed to protect against, the transistor controller 504, in response, can generate a voltage bias through the gate drive output pin 512 to turn off the transistor 502. In this example, by turning off the transistor 503, no current passes through the transistor 502 and thus isolating the voltage bus from other voltage buses (e.g., other sub-buses). Over current can occur, for example, when a voltage bus is shorted to a ground, when electronic components draw too much current (i.e., power), or alternatively, too many electronic components being connected to a voltage bus. By isolating the voltage bus, the eFuse 500 can protect a power distribution system (e.g., the power distribution system 200 of FIG. 2) from being dragged down by an overcurrent or short circuit event. In this way, other electronic components connected to the power distribution system remain functional and not affected by the overcurrent event. For example, a power distribution system can distribute_power to a LiDAR and a fan that cools batteries in two separate voltage buses (e.g., sub-buses), with each voltage bus protected by an eFuse. In this example, if a short develops in the voltage bus to which the fan is connected to, an overcurrent event would result and, correspondingly, the corresponding eFuse would be turned off so no power is delivered to the fan. In this example, because the LiDAR is on a different voltage bus, power delivery to the LiDAR will not be affected and the LiDAR will continue to be functional. In some embodiments, when a fault, such as over-current, clears, the eFuse 500 can be turn back to an on state so power delivered through the eFuse 500 is restored. For example, the transistor controller 504 can generate a voltage bias through the gate drive output pin 512 to turn on the transistor 502, allowing current to flow through the transistor 502.

Figure 6:
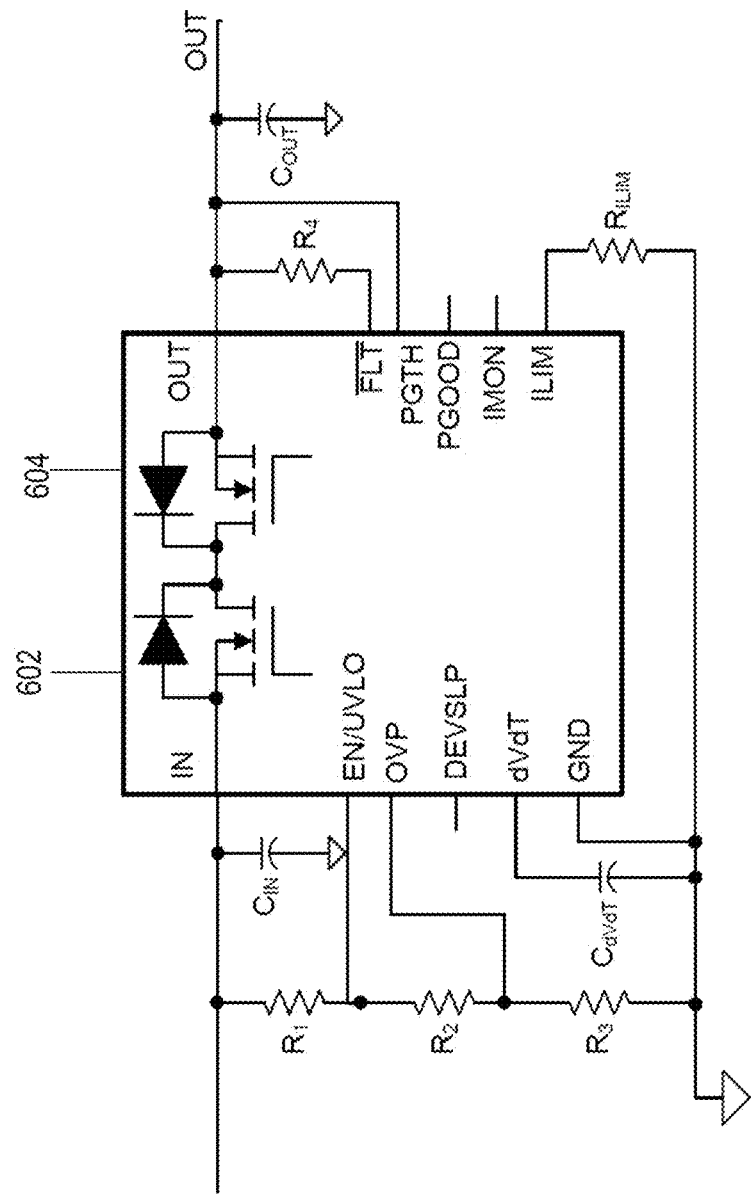
FIG. 6 illustrates an exemplary electrically programmable fuse, in accordance with various embodiments of the present disclosure.

FIG. 6 illustrates an exemplary electrically programmable fuse (eFuse) 600, in accordance with various embodiments of the present disclosure. In some embodiments, the eFuse 600 can be used in combination with the relay 242 of FIG. 2. In FIG. 6, the eFuse 600 includes integrated back-to-back transistors 602 and 604, which may be N-Channel MOSFETS that provide bidirectional current control to prevent current drainage back to a failed supply bus. The eFuse 600 is programmed to include overcurrent, $dV_o/dt$ ramp, overvoltage, and undervoltage thresholds. In general, the eFuse 600 functions similar to the eFuse 500 discussed in reference to FIG. 5. For example, like the eFuse 500, the eFuse 600 can provide protect against an overcurrent or short circuit event. In some cases, like the eFuse 500, the eFuse 600 can be configured to restore power distributed through the eFuse 600, for example, through a microcontroller such as the microcontroller 280.

Figure 7:
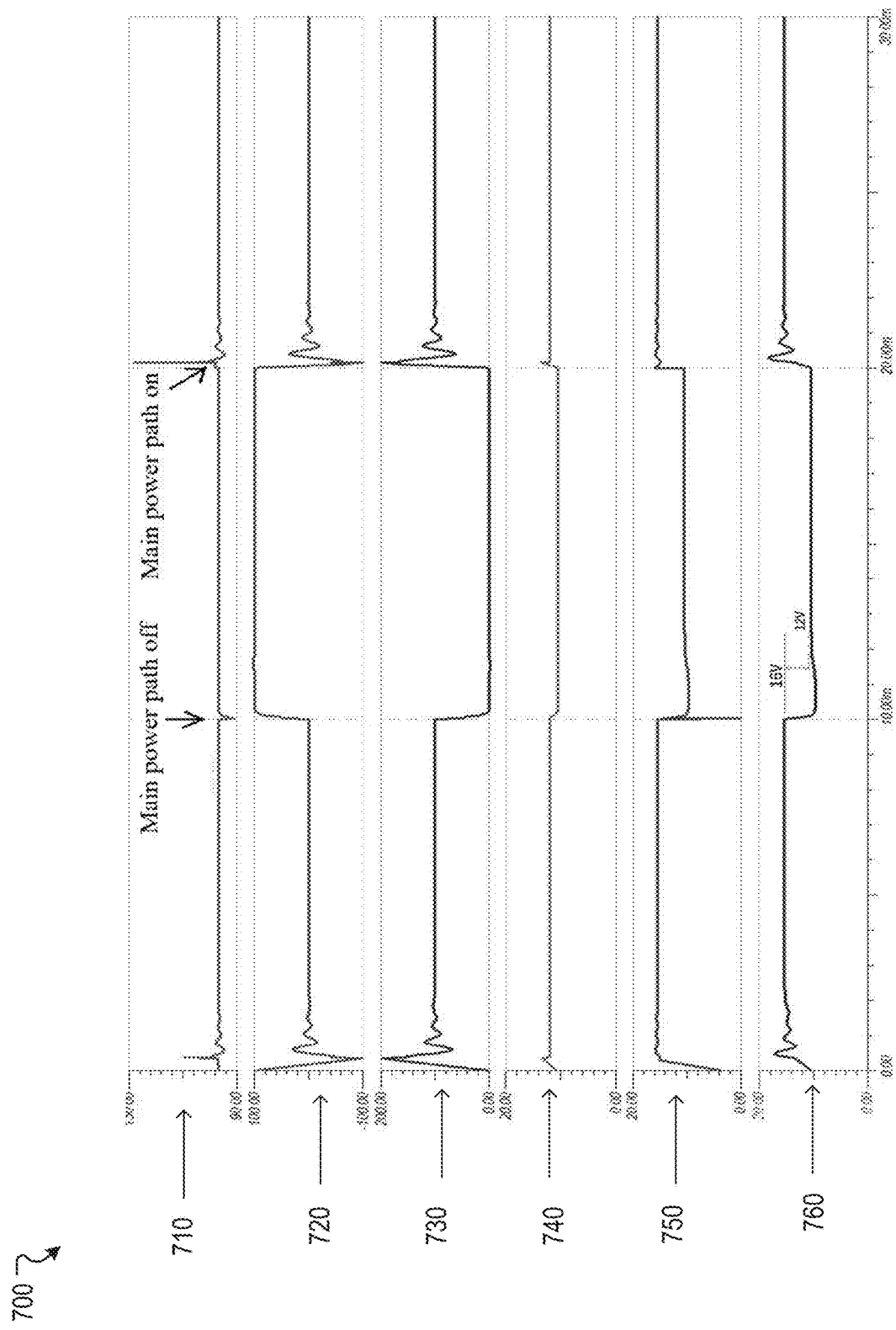
FIG. 7 illustrates a simulation result of a power source selection module, in accordance with various embodiments of the present disclosure.

FIG. 7 illustrates a simulation result 700 of a power source selection module, in accordance with various embodiments of the present disclosure. As shown in the simulation result 700, graph 710 illustrates a total amount of current passing through the power source selection module, such as OR-ing controllers 402 and 404 of FIG. 4. The total current is summed from both a main power path such as the main power path 214 of FIG. 2 and a backup power path such as the backup power path 224 of FIG. 2. The total current as shown in the graph 710 stays relatively constant, with some vibrations at times 10 ms and 20 ms, when the main power is switched off and on, respectively. Graph 720 illustrates an amount of current passing through the backup power path. As the backup power path is switched on at times between 10 ms and 20 ms, the current passing through the backup power path is increased during those times, but no current flows through the backup power path outside of those times because the backup power path is switched off. Graph 730 illustrates an amount of current passing through the main power path. As the main power path is switched off at times between 10 ms and 20 ms, the current passing through the main power path is decreased to zero during those times, and outside of those times, current does flow through the main power path because the power is switched on at those times. Graph 740 illustrates a total voltage across the backup power path, which stays relatively constant at 12 volts throughout the entire time. Graph 750 illustrates a total voltage across the main power path, which has a voltage of 16 volts. When the power across the main power path is switched off, the voltage across the main power path decreases to 12 volts because the main power path is now powered through the backup power path. Graph 760 illustrates a total output voltage. Up until time 10 ms, the output voltage is 16 volts because the main power path is switched on. Between times 10 ms and 20 ms, the output voltage is 12 volts because the backup power path is switched on. After time 20 ms, the output voltage is 16 volts because the main power path is switched on. Thus, as a result of the OR-ing controller, an output current is maintained to be constant while an output voltage matches a voltage across whichever path is switched on.

Figure 8A:
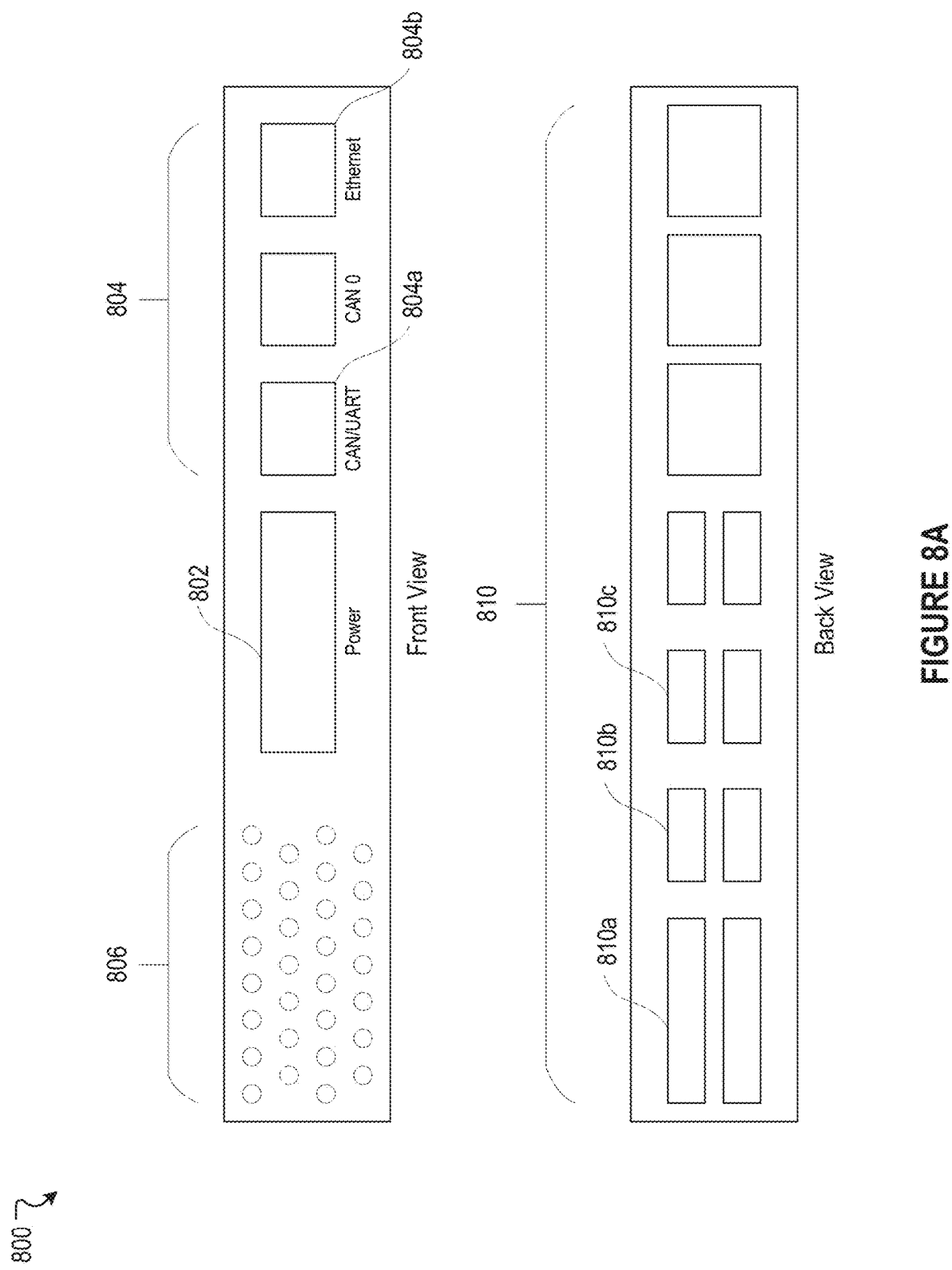
FIG. 8A illustrates an exemplary power distribution system, in accordance with various embodiments of the present disclosure.

FIG. 8A illustrates an exemplary power distribution system 800, in accordance with various embodiments of the present disclosure. FIG. 8A shows a front view and a back view of the power distribution system 800. As shown in the front view in FIG. 8A, in some embodiments, the power distribution system 800 can include a input power port 802 and a plurality of communication ports 804. The input power port 802 can be used to connect dual power sources to the power distribution system 800. For example, power from a primary power source (e.g., the primary power source 120 of FIG. 1) and power from a redundant power source (e.g., the redundant power source 122 of FIG. 1) can be routed to the power distribution system 800 by connecting a cable or a harness from the primary power source and the redundant power source to the input power port 802. The plurality of communication ports 804 can be used to establish communication between the power distribution system 800 to other computing systems or devices, thereby allowing the power distribution system 800 to transmit data (e.g., telemetry) such as voltages, currents, and status of relays and eFuses associated with various voltage buses and sub-buses to the other computing systems or devices. For example, the power distribution system 800 can be connected to a CAN bus through a CAN port 804a, thereby allowing the power distribution system 800 to report telemetry through the CAN bus to a data processing computing system of an autonomous vehicle. As another example, the power distribution system 800 can be connected to an ethernet network through an ethernet port 804b, thereby allowing the power distribution system 800 to report telemetry through the ethernet network (e.g., a local area network or LAN). Also shown in the front view, in some embodiments, the power distribution system 800 can include a plurality of proliferated holes through which fans (e.g., the one or more fans 294 of FIG. 2) associated with the power distribution system 800 can create air flows to cool the power distribution system 800.

As shown in the back view in FIG. 8A, in some embodiments, the power distribution system 800 can include a plurality of output power ports 810. Each of the plurality of output power ports 810 can correspond to each of a plurality of sub-buses or voltage buses (e.g., the plurality of sub-buses 116a-116n of FIG. 1). For example, a power output port 810a can correspond to sub-bus 116a of FIG. 1, or alternatively, to the sub-bus or channel 230 of FIG. 2. In some embodiments, each output of the plurality of output power ports 810 can be configured or adapted to fit a particular power port standard. For example, the power output port 810a can be fitted with a particular connector type to provide power to a specific power port of an electronic component. For instance, the power output port 810a can be fitted with a connector compatible with a harness to provide power to a LiDAR and output power ports 810b, 810c can be fitted with connectors compatible with harnesses to provide power to cameras. Many variations are possible.

Figure 8B:
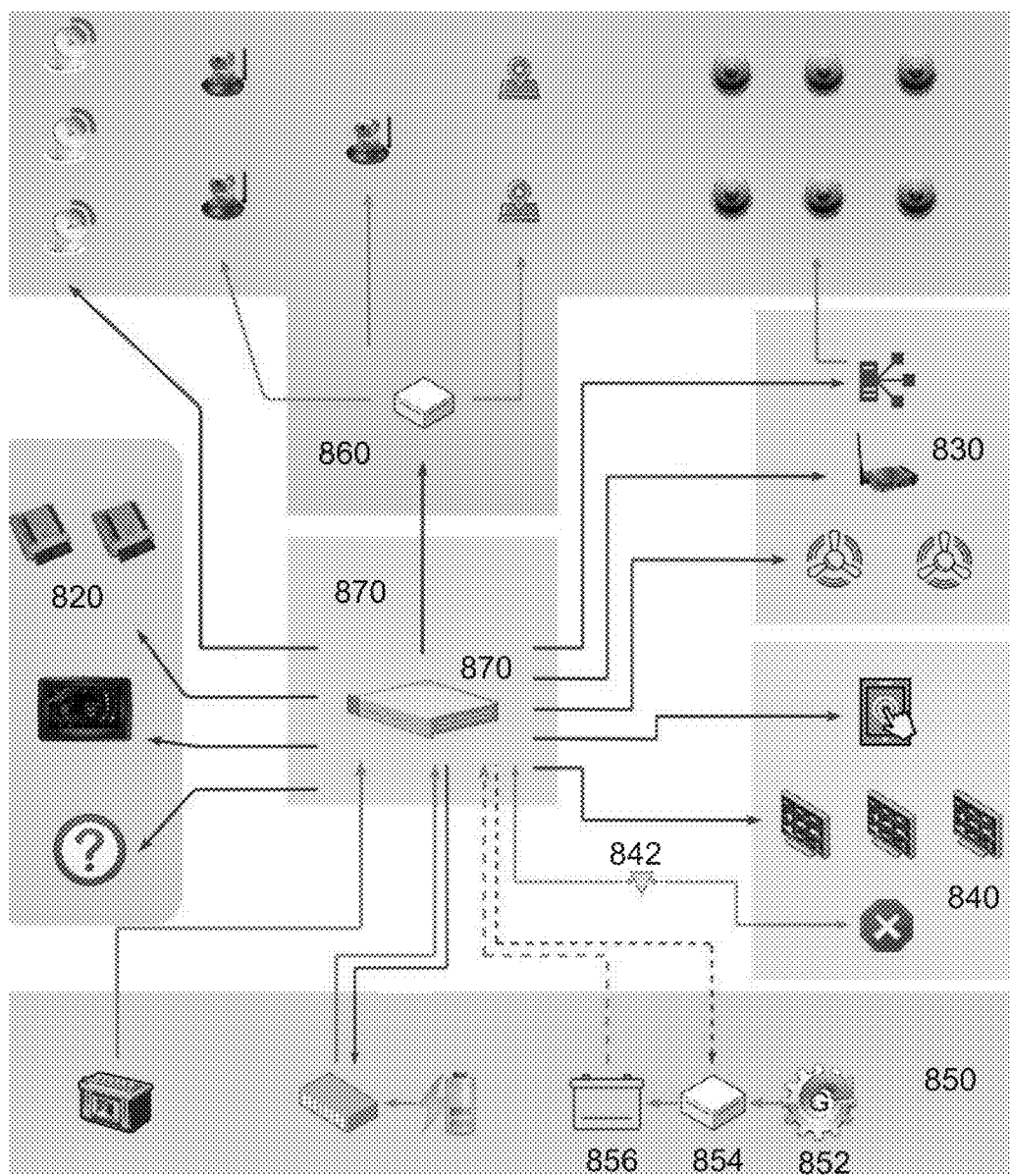
FIG. 8B illustrates an exemplary diagram of an implementation of a power distribution system, according to an embodiment of the present disclosure.

FIG. 8B illustrates an exemplary diagram of an implementation of a power distribution system, in accordance with the embodiments shown in previous FIGS. 1-7 and 8A. In FIG. 8B, a power distribution system 872 may be disposed in a trunk 870 of a vehicle, such as the vehicle 101. The power distribution system 872 may be implemented as the power distribution system 110 or 200. The power distribution system 872 may supply power and connect to electronic components throughout the vehicle, including on a roof 860, drive by wire (DBW) components 820, a trunk 830, a cabin 840, and a floor 850. Safety interlock features 842 may include high voltage (HV) and thermal monitoring and interlock mechanisms. For instance, if a junction temperature of a transistor in the power distribution system 872 exceeds a threshold temperature, the gate across the transistor may be switched off, and/or an associated eFuse may be switched off. Other power sources such as an alternator 852 may generate an alternating current, to be converted into a direct current by an alternating current (AC)/direct current (DC) converter 854. The direct current may charge a secondary battery 856. Moreover, power generating mechanisms such as regenerative braking may supply additional alternating current to be converted by the AC/DC converter 854. For example, the a kinetic energy of the movement of the vehicle 101 may be converted into the alternating current during deceleration of the vehicle using a motor connected to a brake. In some examples, the motor may run in a reverse direction during braking.

The power distribution system 872 may further include a single channel cover that may be designed to a programmable ingress protection (IP) standard for high computation equipment from 30 A to 120 A. The power distribution system 872, when attached to the vehicle, is damped from vibrations of the vehicle while driving. The power distribution system 872 may further have multiple states including a normal operational mode while the vehicle is running but will go into sleep mode when the vehicle stops running to conserve the main power supply and/or low-voltage battery.

Figure 9A:
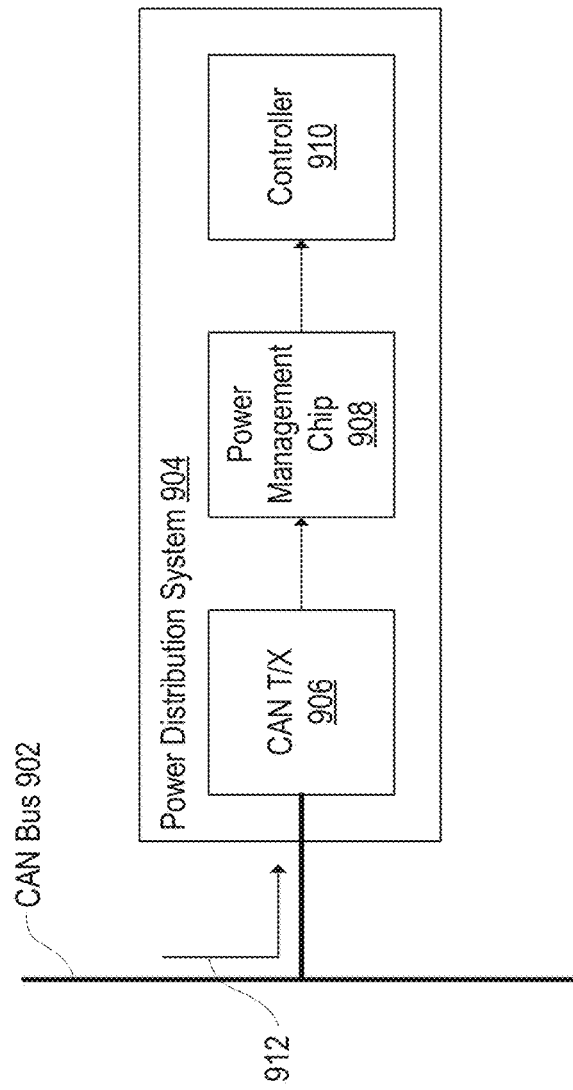
FIG. 9A illustrates a wake sequence of a power distribution system, in accordance with various embodiments of the present disclosure.

FIG. 9A illustrates a wake sequence 900 of a power distribution system, in accordance with various embodiments of the present disclosure. As shown in FIG. 9A, in some embodiments, a power distribution system 904 (e.g., the power distribution system 110 of FIG. 1) can be communicatively coupled to a CAN bus 902. Through the CAN bus 902, the power distribution system 904 can report telemetry of various voltage buses to a data processing computing system of an autonomous vehicle. In some embodiments, the data processing computing system can cause the power distribution system 904 to execute the wake sequence 900 by sending a wake command 912 through the CAN bus 902. The wake command 912 can be received by a CAN transceiver 906 through a CAN port of the power distribution system 904 (e.g., the CAN port 804a of FIG. 8A). The CAN transceiver 906 can then cause a power management chip 908 to be waken up. The power management chip 908 may be controlled by a controller 910 using a serial peripheral interface (SPI) bus. The controller 910 may be implemented as the controller module of FIG. 1 or the microcontroller 280 of FIG. 2. As a result of the power management chip 908 being waken up, the power management chip 908 may enable or turn on various components, such as relays, eFuses, and electric power converters, associated with the power distribution system 910. The boot sequence will be discussed in further detail in reference to FIG. 9B immediately below.

Figure 9B:
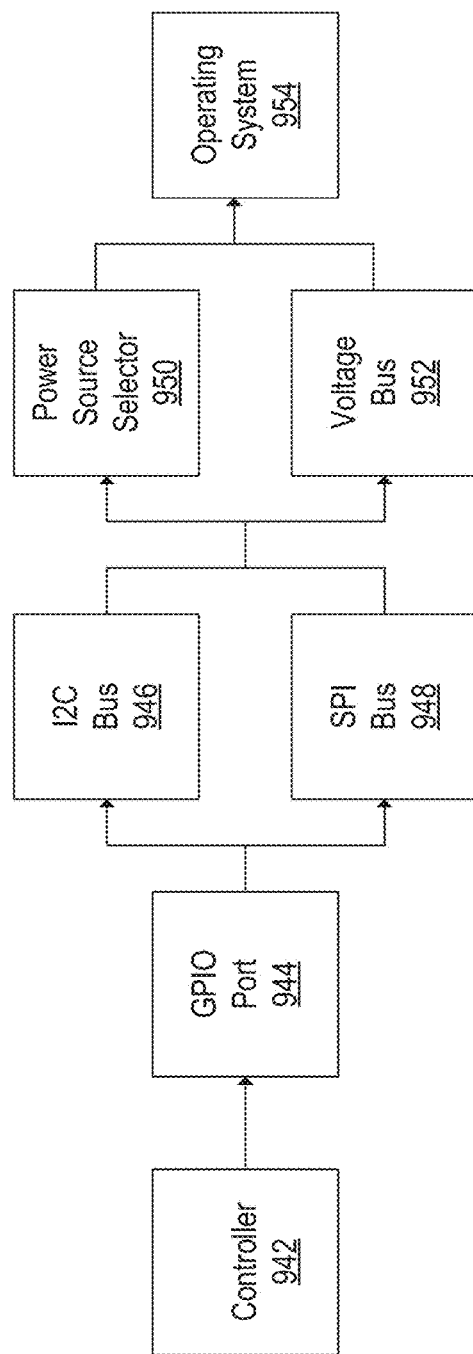
FIG. 9B illustrates a boot sequence of a power distribution system, in accordance with various embodiments of the present disclosure.

FIG. 9B illustrates a boot sequence 940 of a power distribution system, in accordance with various embodiments of the present disclosure. Once a controller 942 (e.g., the controller 910 of FIG. 9A) is turned on by a wake command (e.g., the wake command 912 of FIG. 9A), the controller 942 can generate commands (e.g., signals, operating voltages) to turn on various circuits of a power distribution system (e.g., the power distribution system 904 of FIG. 9A). These commands can be distributed through a general purpose input and output (GPIO) port 944 to an inter-integrated circuit (I2C) bus 946 and/or a serial peripheral interface (SPI) bus 948 to turn on components or controllers that control and monitor various relays, transistors, and/or eFuses associated with various voltage buses of the power distribution system. For example, the controller 942 may send a command through the GPIO port 944 and the SPI bus 948 to a power source selector 950 (e.g., the power source selection module 112 of FIG. 1) to select a power source from which to distribute power. As another example, the controller 942 may send a command through the GPIO port 944 and the I2C bus 946 to enable or turn on a voltage bus 952 (e.g., the main power bus 114 and/or the plurality of sub-buses of FIG. 1) to enable power downstream of the voltage bus 952. Many variations are possible. For example, the controller 942 may send a command to the power source selector 950 through the I2C bus 946 instead of the SPI bus 948. Likewise, the controller 942 may send a command to enable the voltage bus 952 through the SPI bus 948 instead of the I2C bus 946. Once various voltage buses of the power distribution system are turned on, the boot sequence 940 can boot up an operating system with which to manage various computing tasks (e.g., threads, shells, instructions, etc.) associated with the power distribution system. In some embodiments, the operation system can be a real-time operating system (RTOS) designed specifically for embedded systems. For example, the real-time operating system may be implemented using FreeRTOS.

Figure 9C:
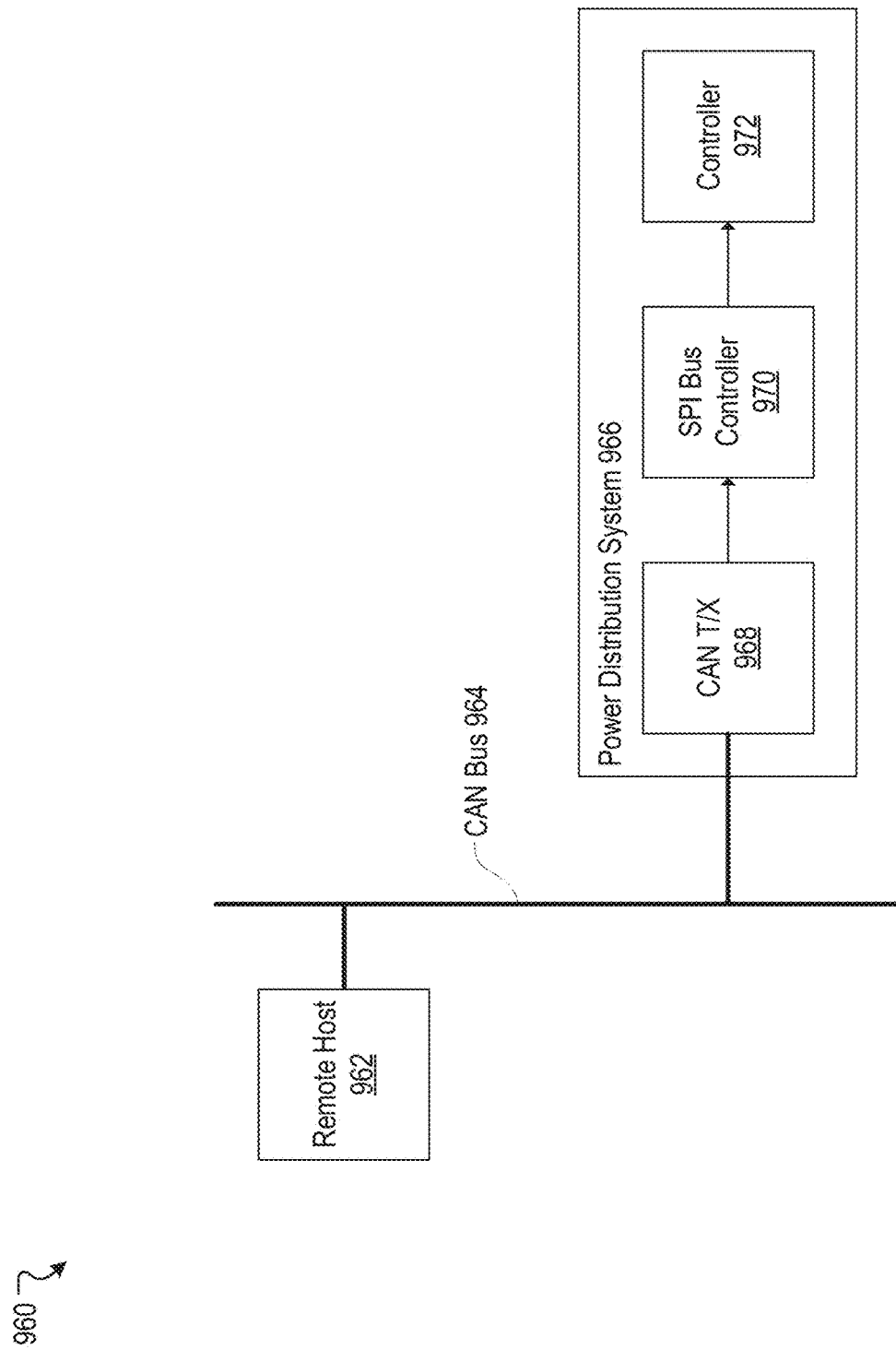
FIG. 9C illustrates a sleep sequence of a power distribution system, in accordance with various embodiments of the present disclosure.

FIG. 9C illustrates a sleep sequence 960 of a power distribution system, in accordance with various embodiments of the present disclosure. As shown in FIG. 9C, upon detection of a vehicle being in an off state, a remote host 962 can send a sleep command, through a CAN bus 964, to a power distribution system 966 to cause the power distribution system 966 to power down. A CAN transceiver 968 may receive the sleep command and forward this sleep command to a controller 972, which may be implemented as the controller module of FIG. 1 or the microcontroller 280 of FIG. 2. The controller 972 may prepare to enter a sleep sequence by turning off all buses and sub-buses, wait until the CAN transceiver 968 is idle, and program a power management chip 970 to enter a sleep mode. The power management chip 970 may be controlled by the controller 972 using a serial peripheral interface (SPI) bus. The power management chip may enter the sleep mode unless preempted. The sleep mode may be preempted by a wake command from the remote host 962 or from another remote host.

The power distribution system may store log data, such as persistent data during the aforementioned sequences and calibration data, to persistent storage which may include two 512-byte buffers in RAM. One of the buffers may receive new log data white the other buffer may be written to flash in the background if that other buffer is full.

FIG. 10 illustrates a flowchart of a method 1000, in accordance with various embodiments of the present disclosure. In this and other flowcharts, the flowchart 1000 illustrates by way of example a sequence of steps. It should be understood the steps may be reorganized for parallel execution, or reordered, as applicable. Moreover, some steps that could have been included may have been removed to avoid providing too much information for the sake of clarity and some steps that were included could be removed, but may have been included for the sake of illustrative clarity. The description from other FIGURES may also be applicable to FIG. 10.

In step 1002, the method 1000 can detect a fault in a sub-bus of a plurality of sub-buses based on a telemetry signal from an electrically programmable fuse (eFuse) associated with the sub-bus, wherein the plurality of sub-buses are coupled to a main power bus. In step 1004, the method 1000 can determine a fault type associated with the fault based on the telemetry signal from the eFuse. In step 1006, the method 1000 can generate a command to cause a relay associated with the sub-bus to change to a relay state.

The techniques described herein, for example, are implemented by one or more special-purpose computing devices. The special-purpose computing devices may be hard-wired to perform the techniques, or may include circuitry or digital electronic devices such as one or more application-specific integrated circuits (ASICs) or field programmable gate arrays (FPGAs) that are persistently programmed to perform the techniques, or may include one or more hardware processors programmed to perform the techniques pursuant to program instructions in firmware, memory, other storage, or a combination.

Figure 11:
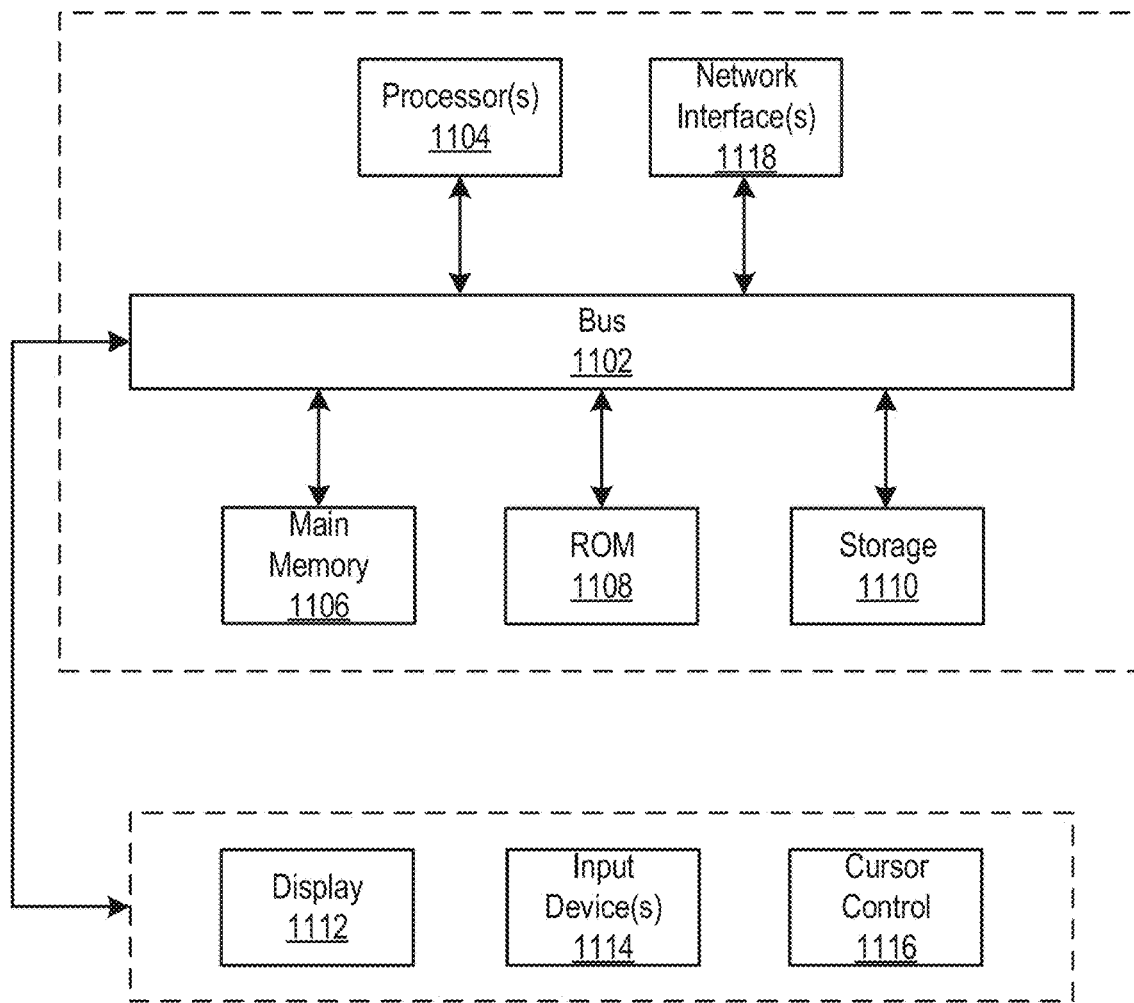
FIG. 11 is a block diagram that illustrates a computer system upon which any of embodiments described herein may be implemented.

FIG. 11 is a block diagram that illustrates a computer system 1100 upon which any of the embodiments described herein may be implemented. The computer system 1100 includes a bus 1102 or other communication mechanism for communicating information, one or more hardware processors 1104 coupled with bus 1102 for processing information. A description that a device performs a task is intended to mean that one or more of the hardware processor(s) 1104 performs.

The computer system 1100 also includes a main memory 1106, such as a random access memory (RAM), cache and/or other dynamic storage devices, coupled to bus 1102 for storing information and instructions to be executed by processor 1104. Main memory 1106 also may be used for storing temporary variables or other intermediate information during execution of instructions to be executed by processor 1104. Such instructions, when stored in storage media accessible to processor 1104, render computer system 1100 into a special-purpose machine that is customized to perform the operations specified in the instructions.

The computer system 1100 further includes a read only memory (ROM) 1108 or other static storage device coupled to bus 1102 for storing static information and instructions for processor 1104. A storage device 1110, such as a magnetic disk, optical disk, or USB thumb drive (Flash drive), etc., is provided and coupled to bus 1002 for storing information and instructions.

The computer system 1100 may be coupled via bus 1102 to output device(s) 1112, such as a cathode ray tube (CRT) or LCD display (or touch screen), for displaying information to a computer user. Input device(s) 1114, including alphanumeric and other keys, are coupled to bus 1102 for communicating information and command selections to processor 1104. Another type of user input device is cursor control 1116. The computer system 1100 also includes a communication interface 1118 coupled to bus 1102.

Unless the context requires otherwise, throughout the present specification and claims, the word "comprise" and variations thereof, such as, "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it were individually recited herein. Additionally, the singular forms "a," "an" and "the" include plural referents unless the context clearly dictates otherwise. The phrases "at least one of," "at least one selected from the group of," or "at least one selected from the group consisting of," and the like are to be interpreted in the disjunctive (e.g., not to be interpreted as at least one of A and at least one of B).

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment, but may be in some instances. Furthermore, the particular features, structures, or characteristics may be combined in any suitable manner in one or more embodiment.

A component being implemented as another component may be construed as the component being operated in a same or similar manner as the another component, and/or comprising same or similar features, characteristics, and parameters as the another component.

The invention claimed is:

1. A power distribution system comprising:
a main power bus;
sub-buses coupled to the main power bus, the sub-buses providing power to electrical components of a vehicle, wherein each of the sub-buses includes an electrically programmable fuse (eFuse) in series with a relay; and
a controller configured to:
detect a fault in a sub-bus of the sub-buses;
determine a fault type associated with the fault; and
in response, generate a command to cause the relay to change a relay state.

2. The power distribution system of claim 1, wherein the eFuse comprises a transistor and a transistor controller, wherein the transistor controller is configured to:
generate a first voltage bias to the transistor to cause the transistor to be in an on state, wherein the first voltage bias causes current to flow from the main power bus to a sub-bus through the transistor;
monitor the current through the transistor;
in response to the current exceeding a threshold value, generate a second voltage bias to the transistor to cause the transistor to be in an off state, wherein the second voltage bias ceases the current through the transistor; and
generate a telemetry signal, wherein the telemetry signal indicates a change in a transistor state.

3. The power distribution system of claim 2, wherein:
the controller detects the fault in the sub-bus based on the telemetry signal received from the transistor controller; and
the telemetry signal indicates the transistor changed from the on state to the off state.

4. The power distribution system of claim 3, wherein:
the controller determines the fault type associated with the fault based on the change in the transistor state; and
the fault type is an overcurrent condition.

5. The power distribution system of claim 4, wherein the relay state is an open relay state.

6. The power distribution system of claim 2, wherein the controller is further configured to:
generate a second command to cause the relay to change from the relay state to a second relay state; and
generate a third command to cause the eFuse to clear the fault.

7. The power distribution system of claim 6, wherein the second relay state is a closed relay state.

8. The power distribution system of claim 6, wherein the third command causes the transistor controller of the eFuse to generate the first voltage bias to the transistor to cause the transistor to be in the on state.

9. The power distribution system of claim 1, further comprising:
output power ports, wherein each of the output power ports corresponds to a sub-bus of the sub-buses.

10. The power distribution system of claim 9, wherein the output power ports comprise one or more different connector types through which power to the electronic components of the vehicle is distributed.

11. The power distribution system of claim 1, wherein the electrical components of the vehicle includes groups of: radars, cameras, light detection and ranging (LiDAR) sensors, global positioning system (GPS) devices, communication devices, computing devices, and in-cabinet infotainment devices.

12. The power distribution system of claim 11, wherein each group of the electronic components receives power from a sub-bus of the sub-buses.

13. The power distribution system of claim 1, further comprising:
- one or more temperature sensors;
- one or more fans; and
- wherein the controller is further configured to:
  - monitor temperatures associated with the power distribution system using the one or more temperature sensors; and
  - generate an activation command to activate the one or more fans in response to one of the temperatures exceeding a threshold value.

14. The power distribution system of claim 13, wherein the one or more fans draw power from a sub-bus of the sub-buses.

15. The power distribution system of claim 1, further comprising:
- an input power port configured to received power from a primary power source and a redundant power source, wherein the input power port is connected to the main power bus; and
- communication ports, wherein at least one of the communication ports enables the controller to communicate to computing devices of the vehicle over a local network.

16. A computer-implemented method of operating a power distribution system comprising:
- detecting, by a controller of the power distribution system, a fault in a sub-bus of a plurality of sub-buses based on a telemetry signal received from an electrically programmable fuse (eFuse) associated with the sub-bus, wherein the plurality of sub-buses are coupled to a main power bus of the power distribution system;
- determining, by the controller, a fault type associated with the fault based on the telemetry signal; and
- generating, by the controller, a command to cause a relay associated with the sub-bus to change a relay state.

17. The computer-implemented method of claim 16, wherein the relay state is an open state.

18. The computer-implemented method of claim 16, further comprising:
- generating, by the controller, a second command to cause the relay to change from the relay state to a second relay state; and
- generating, by the controller, a third command to cause the eFuse to clear the fault.

19. The computer-implemented method of claim 18, wherein the second relay state is closed state.

20. The computer-implemented method of claim 18, wherein the third command to cause the eFuse to clear the fault comprises:
- generating a voltage bias to a transistor of the eFuse to cause the transistor to be in an on state, wherein the voltage bias causes current to flow from through the transistor.

* * * * *